(12) United States Patent
Liu et al.

(10) Patent No.: US 10,546,856 B2
(45) Date of Patent: Jan. 28, 2020

(54) CMOS STRUCTURE HAVING LOW RESISTANCE CONTACTS AND FABRICATION METHOD

(71) Applicants: STMICROELECTRONICS, INC., Coppell, TX (US); GLOBALFOUNDRIES INC., Grand Cayman (KY); INTERNATIONAL BUSINESS MACHINES CORPORATION, Armonk, NY (US)

(72) Inventors: Qing Liu, Watervliet, NY (US); Xiuyu Cai, Niskayuna, NY (US); Chun-chen Yeh, Clifton Park, NY (US); Ruilong Xie, Schenectady, NY (US)

(73) Assignees: STMICROELECTRONICS, INC., Coppell, TX (US); GLOBALFOUNDRIES INC., Grand Cayman (KY); INTERNATIONAL BUSINESS MACHINES CORPORATION, Armonk, NY (US)

( * ) Notice: Subject to any disclaimer, the term of this patent is extended or adjusted under 35 U.S.C. 154(b) by 207 days.

(21) Appl. No.: 14/189,509

(22) Filed: Feb. 25, 2014

(65) Prior Publication Data
US 2015/0243660 A1 Aug. 27, 2015

(51) Int. Cl.
*H01L 27/092* (2006.01)
*H01L 21/8238* (2006.01)
(Continued)

(52) U.S. Cl.
CPC ...... *H01L 27/092* (2013.01); *H01L 21/28518* (2013.01); *H01L 21/76897* (2013.01);
(Continued)

(58) Field of Classification Search
CPC ............ H01L 21/28518; H01L 27/092; H01L 21/76897; H01L 23/485; H01L 21/823418; H01L 29/41725; H01L 29/41758
See application file for complete search history.

(56) References Cited

U.S. PATENT DOCUMENTS 6,495,460 B1 * 12/2002 Bertrand ........... H01L 21/28052
257/E21.165
6,872,644 B1 * 3/2005 Buynoski .......... H01L 29/66477
257/E21.198
(Continued)

FOREIGN PATENT DOCUMENTS

EP 2293339 3/2011
WO WO2006060575 6/2007

*Primary Examiner* — Jamie C Niesz
(74) *Attorney, Agent, or Firm* — Seed IP Law Group LLP

(57) ABSTRACT

A method for fabricating a CMOS integrated circuit structure and the CMOS integrated circuit structure. The method includes creating one or more n-type wells, creating one or more p-type wells, creating one or more pFET source-drains embedded in each of the one or more n-type wells, creating one or more nFET source-drains embedded in each of the one or more p-type wells, creating a pFET contact overlaying each of the one or more pFET source-drains, and creating an nFET contact overlaying each of the one or more nFET source-drains. A material of each of the one or more pFET source-drains includes silicon doped with a p-type material; a material of each of the one or more nFET source-drains includes silicon doped with an n-type material; a material of each pFET contact includes nickel silicide; and a material of each nFET contact comprises titanium silicide.

21 Claims, 21 Drawing Sheets

(51) Int. Cl.
  *H01L 21/285*   (2006.01)
  *H01L 21/768*   (2006.01)
  *H01L 23/485*   (2006.01)
  *H01L 29/45*    (2006.01)

(52) U.S. Cl.
  CPC ........ *H01L 21/823814* (2013.01); *H01L 21/823871* (2013.01); *H01L 21/823892* (2013.01); *H01L 23/485* (2013.01); *H01L 29/456* (2013.01)

(56) References Cited

U.S. PATENT DOCUMENTS

| | | | |
|---|---|---|---|
| 8,299,536 B2 | 10/2012 | Matsuki | |
| 2002/0037644 A1* | 3/2002 | Rha | H01L 21/28518 438/656 |
| 2012/0326241 A1* | 12/2012 | Haran | H01L 21/28518 257/401 |
| 2013/0052819 A1* | 2/2013 | Scheiper | H01L 21/28518 438/664 |
| 2013/0320450 A1* | 12/2013 | Hoentschel | H01L 27/0883 257/368 |
| 2015/0035073 A1* | 2/2015 | Ando | H01L 21/28229 257/369 |
| 2015/0187896 A1* | 7/2015 | Kamineni | H01L 29/41791 257/288 |

* cited by examiner

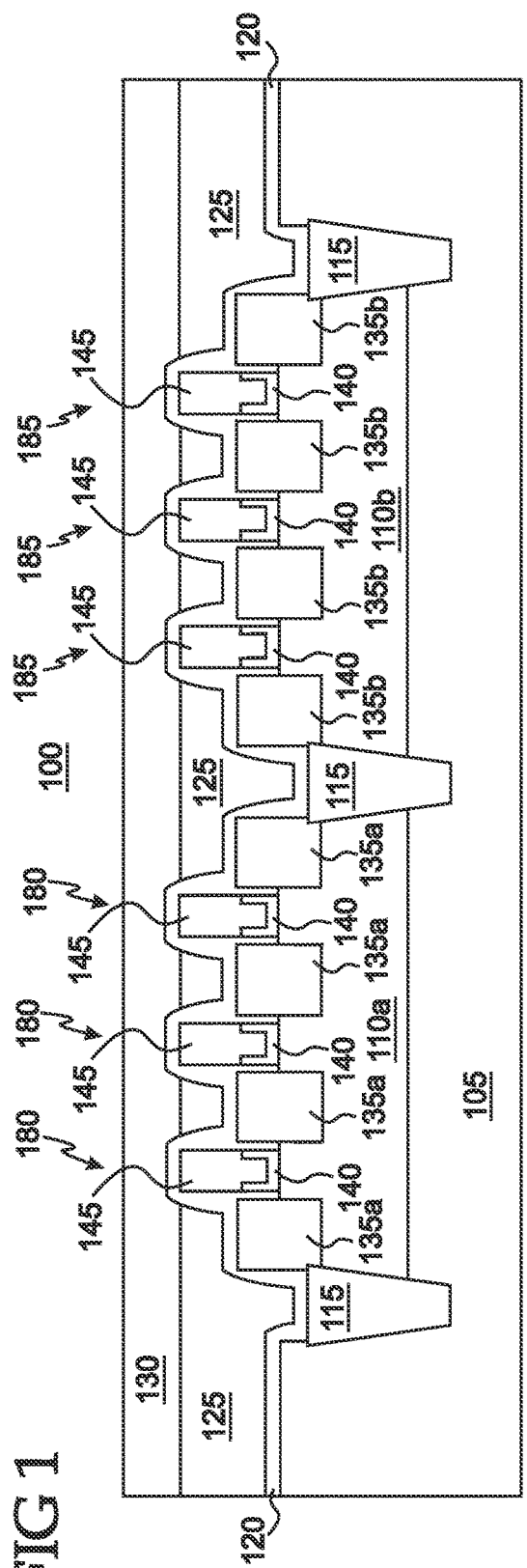
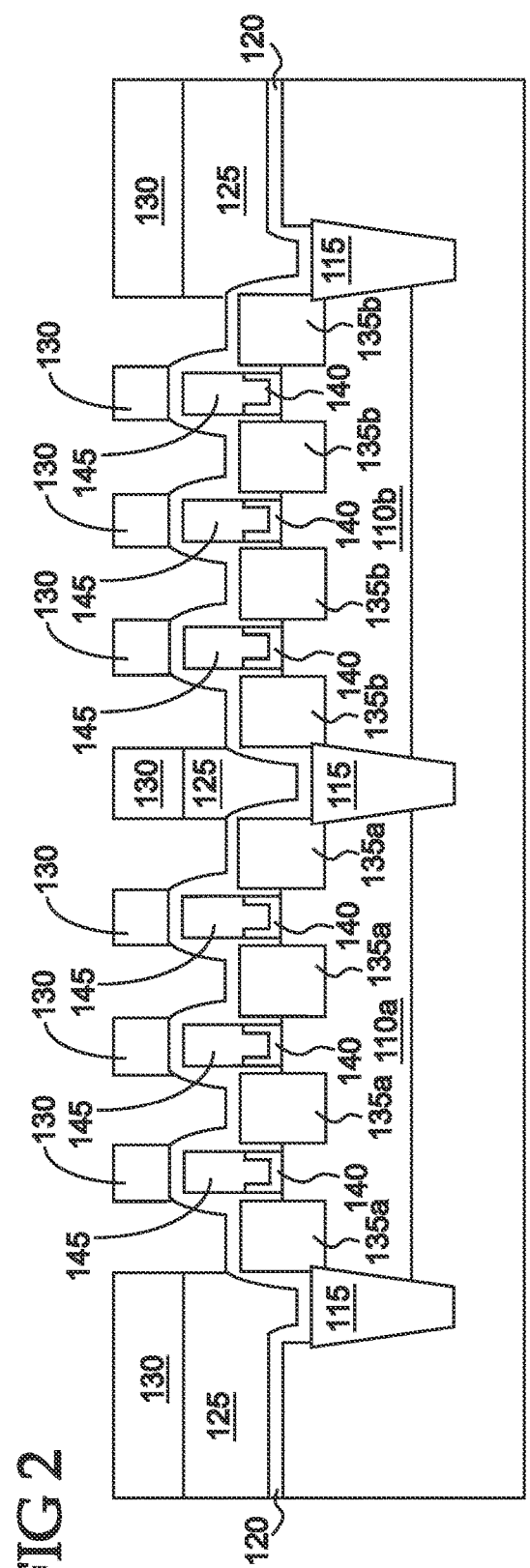

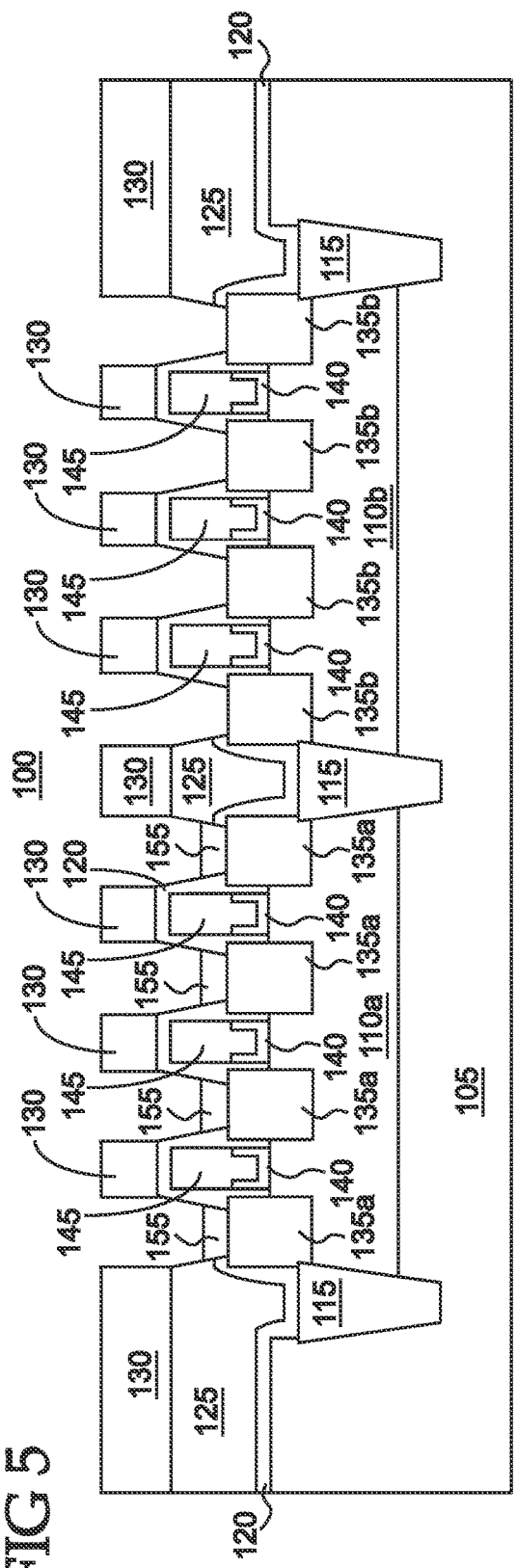
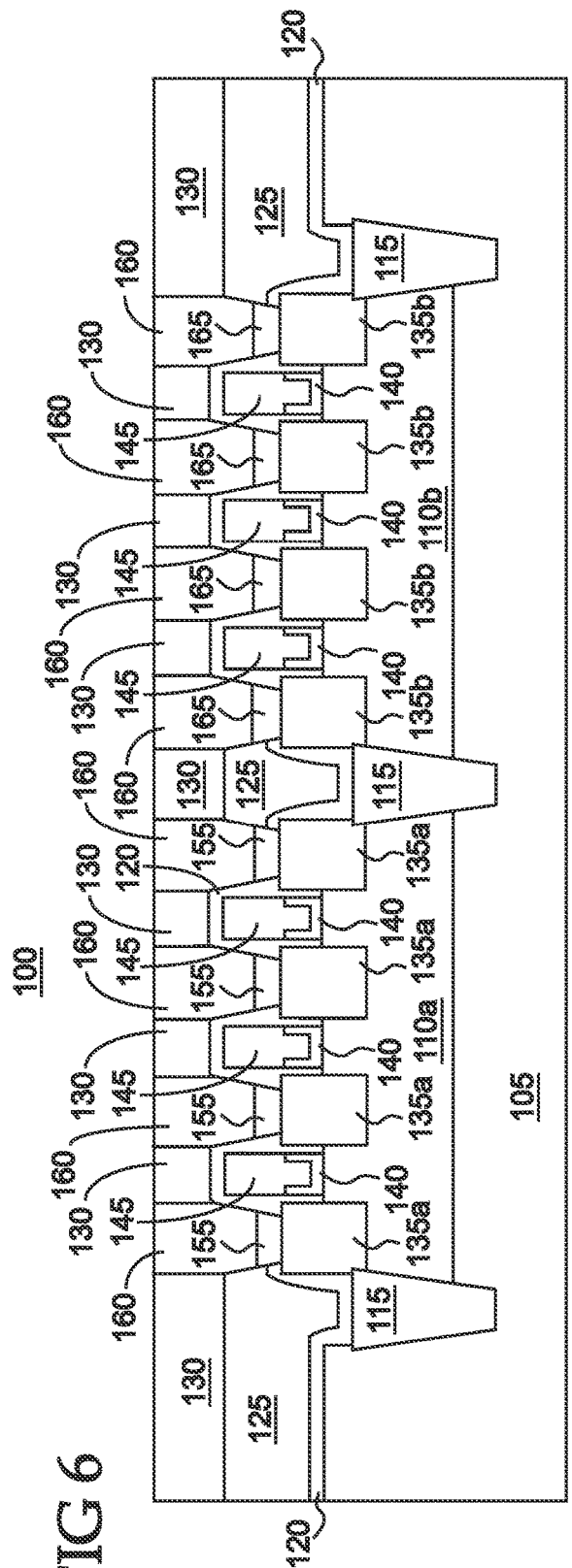

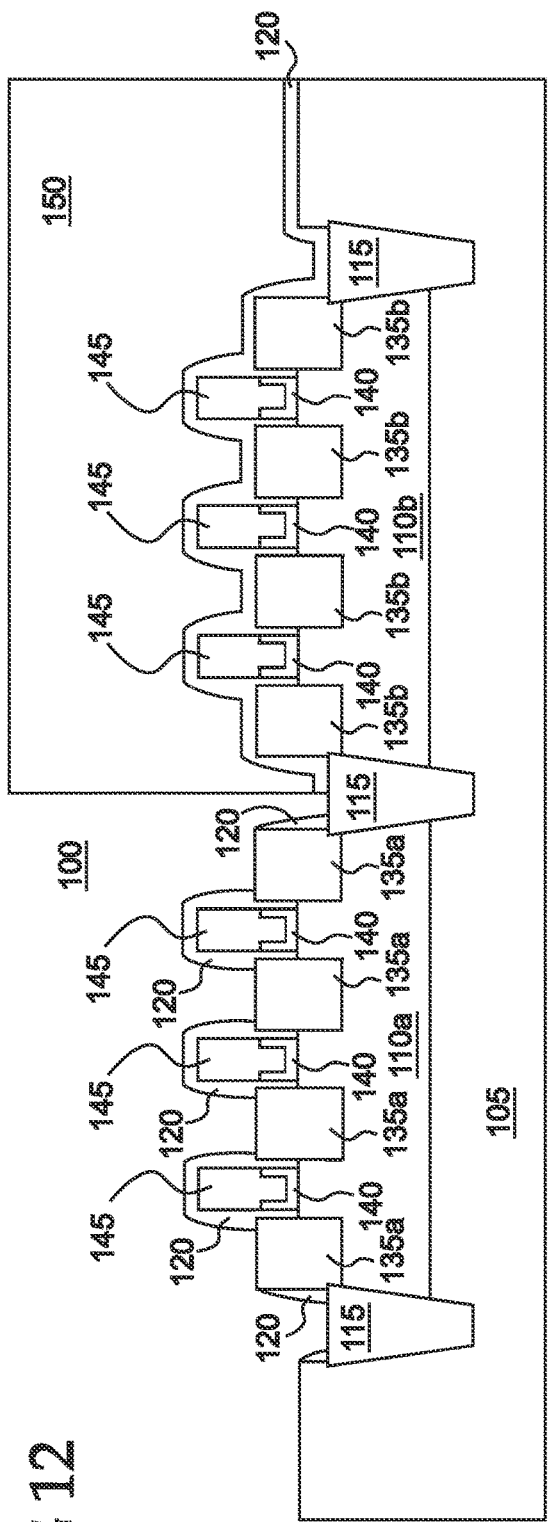
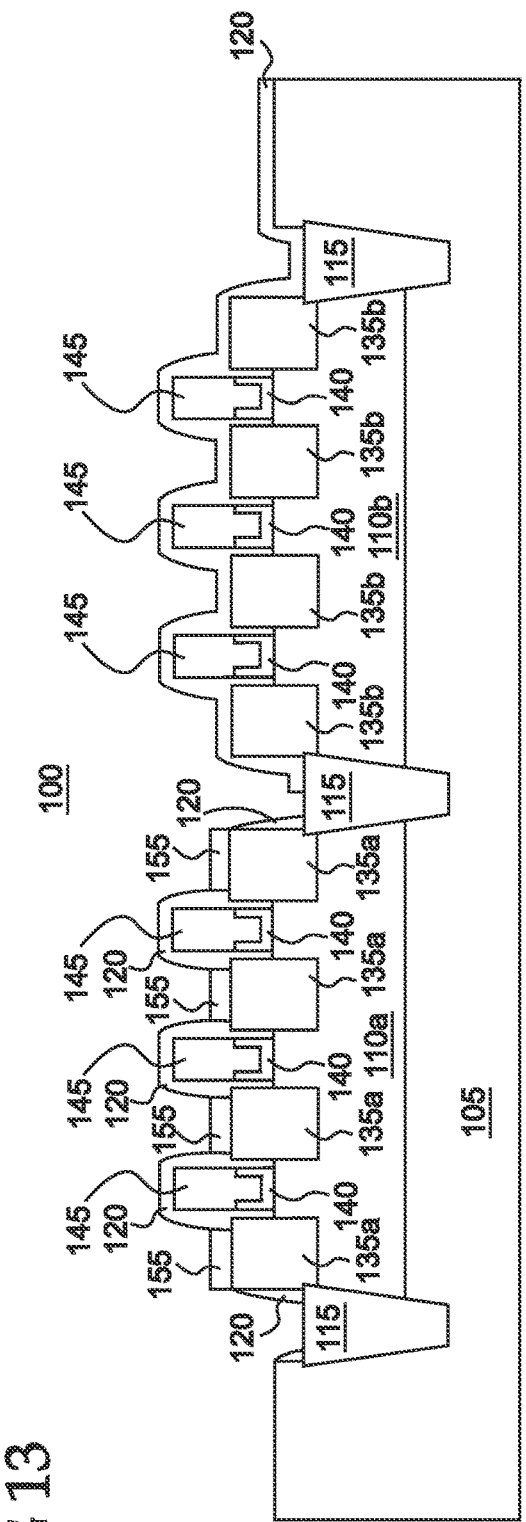

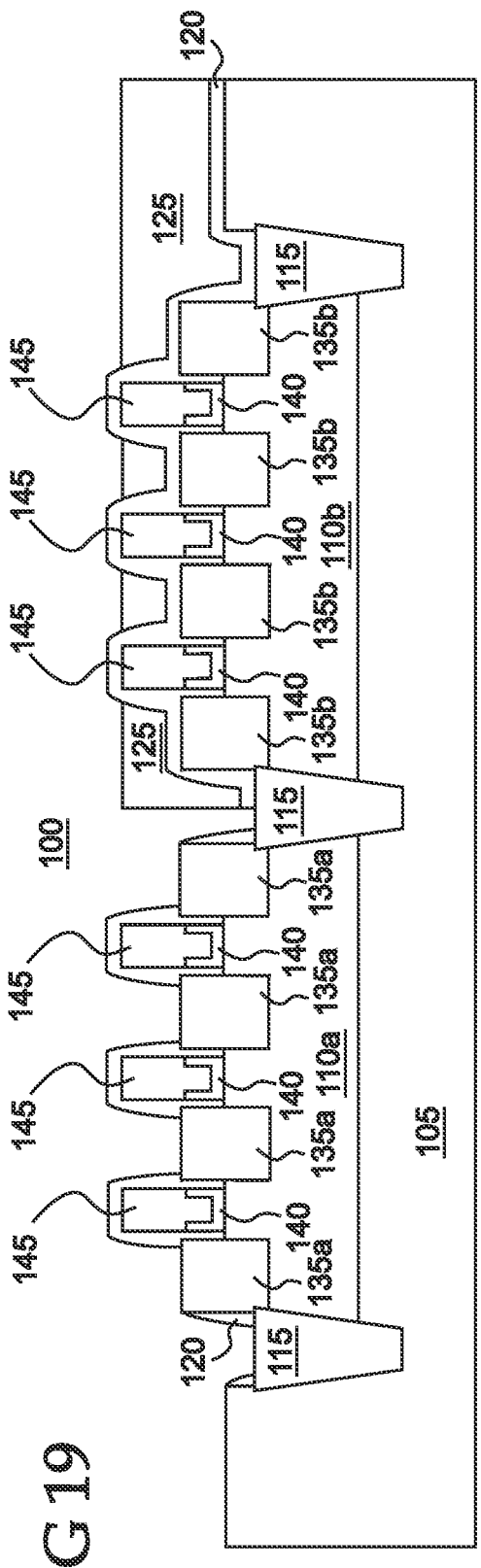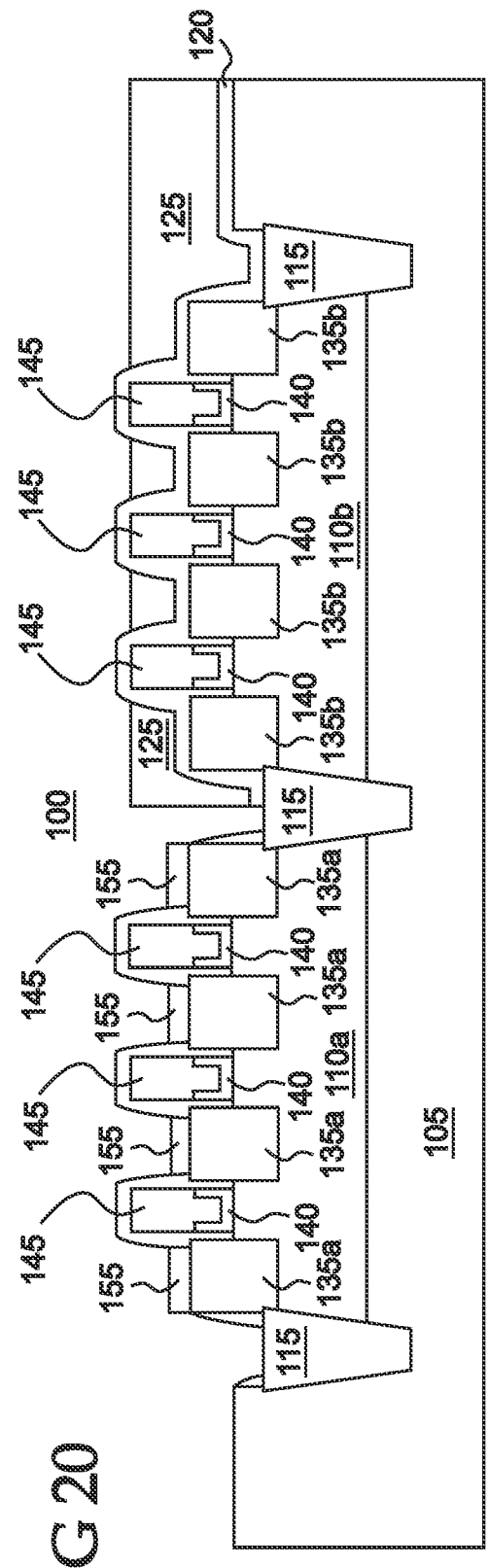

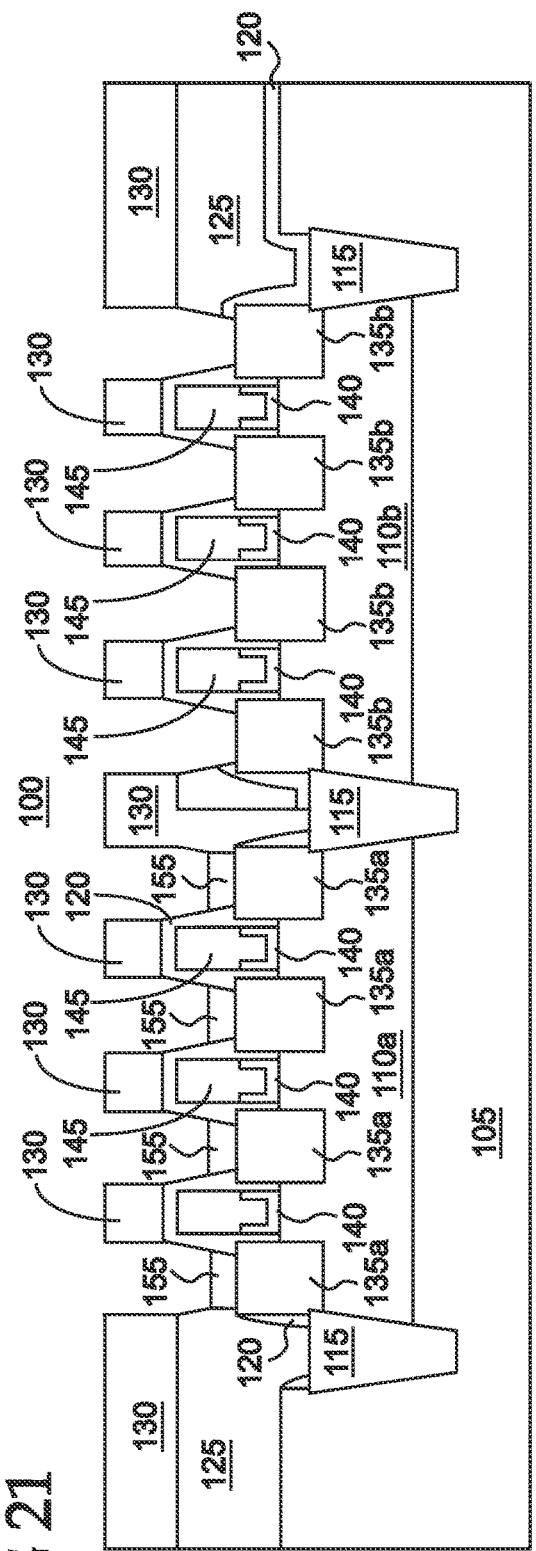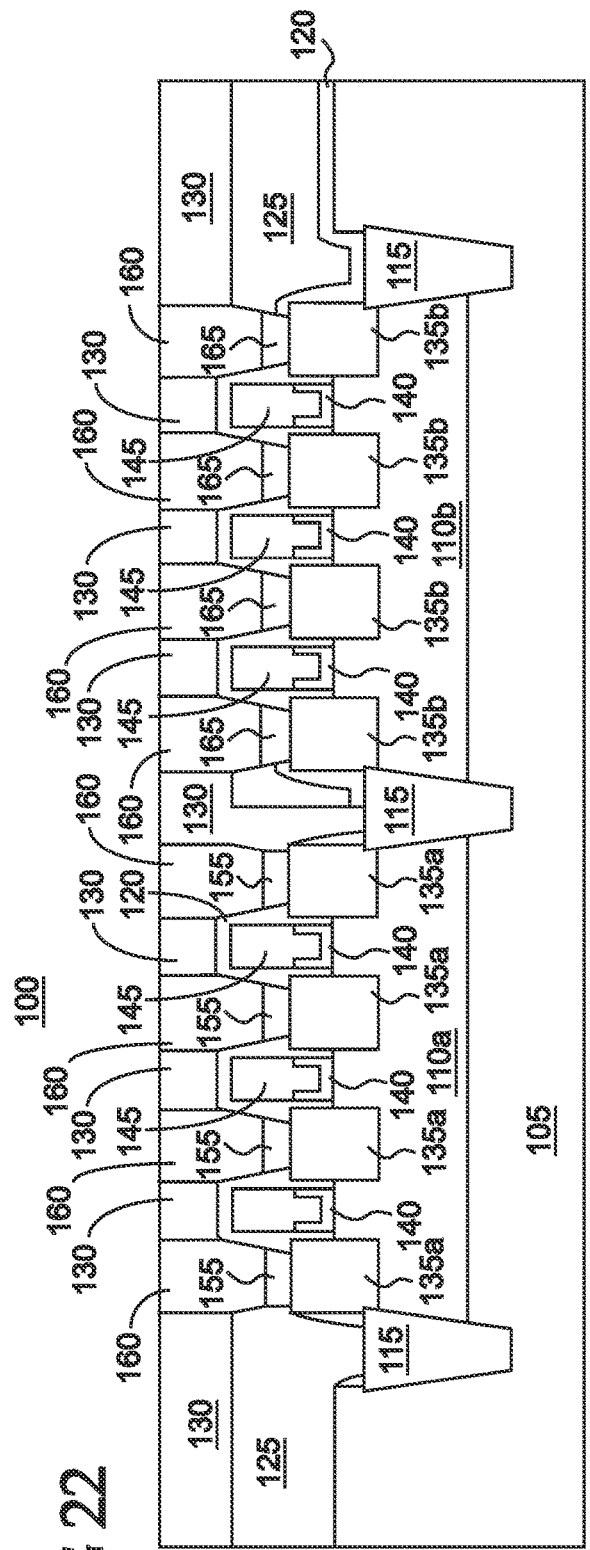

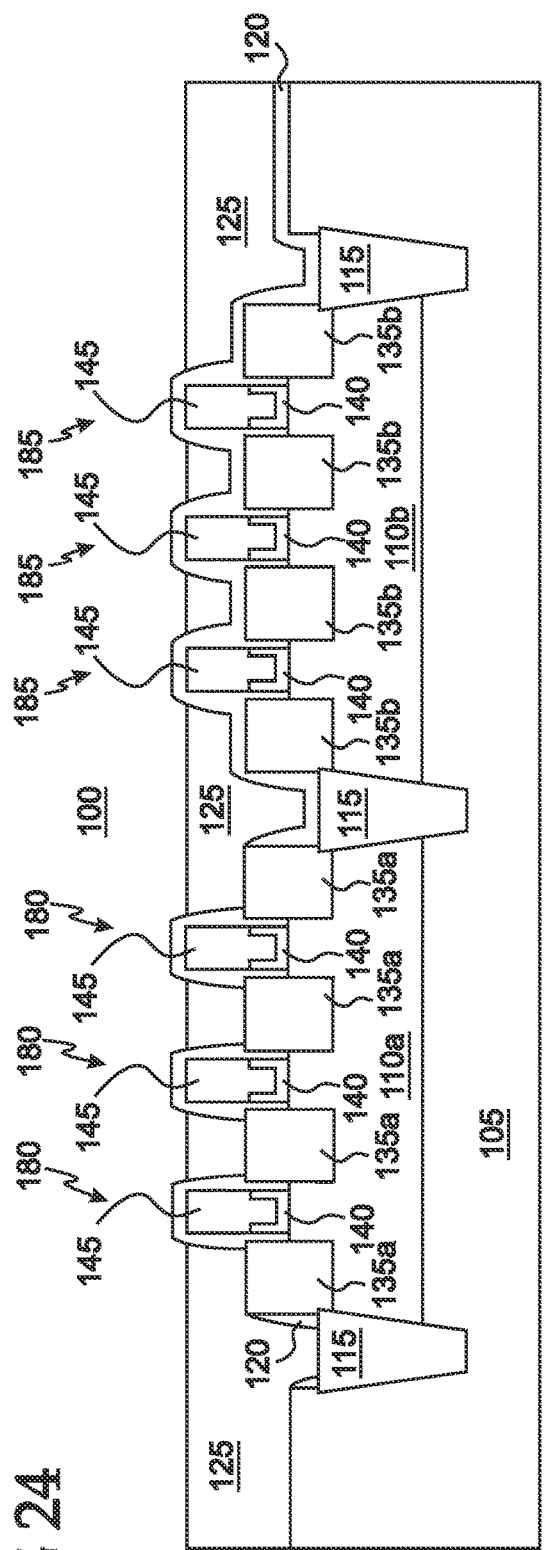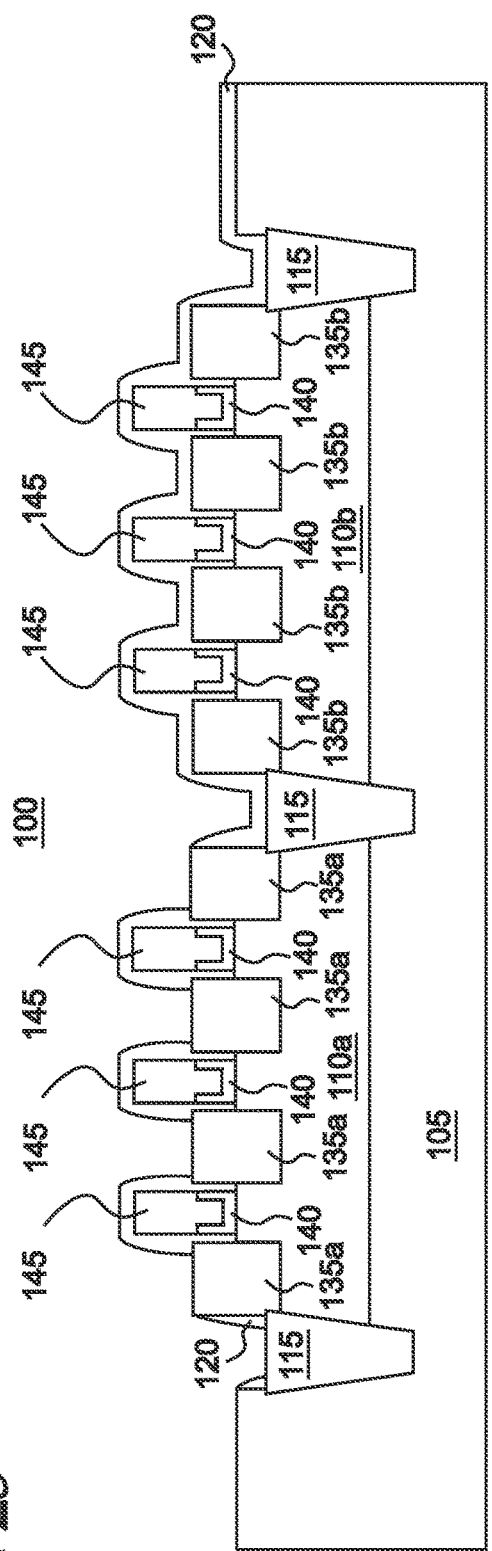

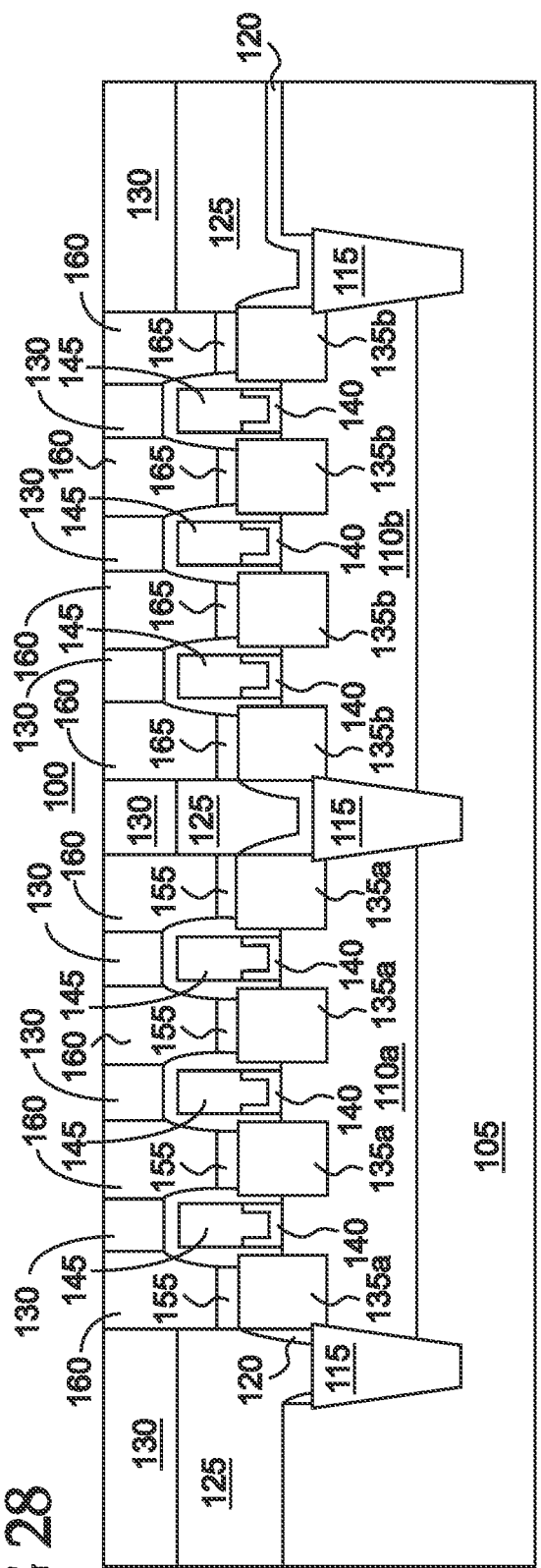
FIG 28
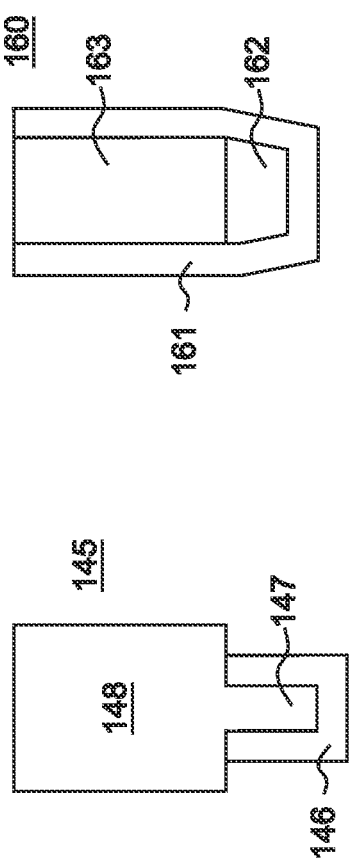
FIG 7
FIG 8

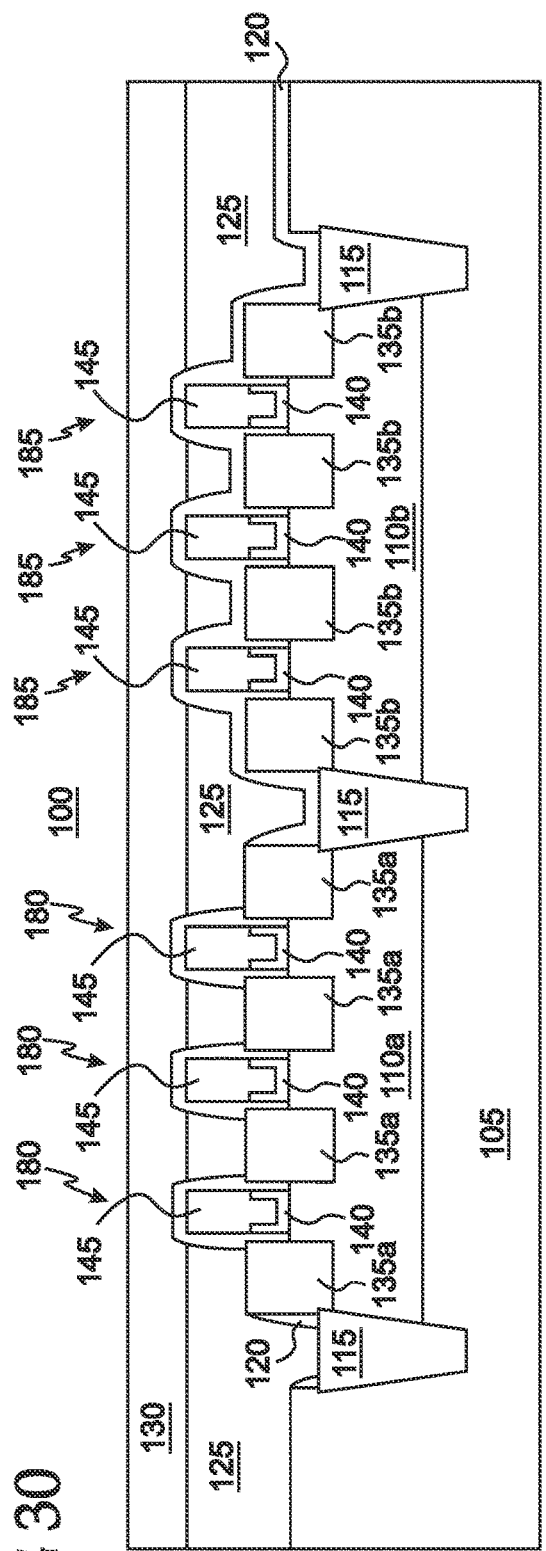
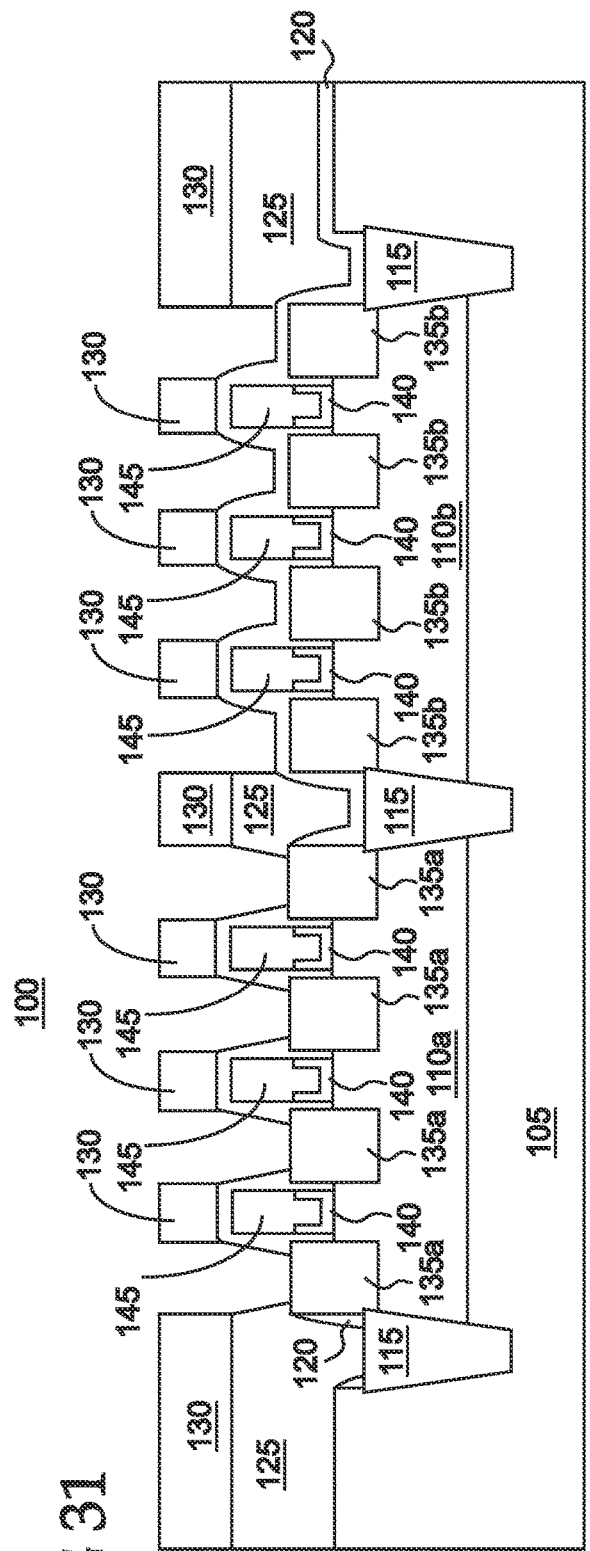

CMOS STRUCTURE HAVING LOW RESISTANCE CONTACTS AND FABRICATION METHOD

JOINT RESEARCH AGREEMENT

The subject matter claimed herein was made as a result of activities undertaken within the scope of a joint research agreement. The parties to the joint research agreement are (1) STMicroelectronics, Inc., (2) International Business Machines Corporation, and (3) GLOBALFOUNDRIES Inc.

TECHNICAL FIELD

The present disclosure relates to the fabrication of CMOS integrated circuits, and in particular, to the fabrication of CMOS integrated circuits with low resistance contacts.

BACKGROUND

Modern electronic systems are often composed of integrated circuits (ICs) fabricated on small rectangular portions of flat wafers. The small rectangular portions of the wafers are commonly known as dies and as chips. Individual components of a given integrated circuit are formed by the addition of successive thin planer layers of various materials and the subsequent removal of portions of the added layers which results in the formation of patterned layers on the wafers. Selected areas of particular patterned layers are then electrically coupled together via contact areas between those layers to form the components and the circuits.

There is a continuing trend toward manufacturing integrated circuits with higher component densities. This downscaling of integrated circuit dimensions can facilitate faster circuit performance and/or switching speeds, and can lead to higher cost efficiency in IC fabrication by providing more circuits on a die and/or more die per semiconductor wafer. Smaller feature sizes of necessity mean contacts having smaller cross-sectional areas.

An important technology used in the construction of integrated circuits is that of Complementary Metal-Oxide-Semiconductor (CMOS) technology due primarily to its low power consumption. In typical digital designs CMOS employs complementary pairs of p-type and n-type metal-oxide-semiconductor field effect transistors (MOSFETs) for logic functions. Since one transistor of the pair is always off, the series combination draws significant power only momentarily during switching between on and off states. Consequently, CMOS devices do not produce as much waste heat as other forms of logic such as transistor-transistor logic (TTL) or NMOS logic, which normally have some standing current even when not changing state.

BRIEF DESCRIPTION OF THE DRAWINGS

Example embodiments of the present disclosure will be described below with reference to the included drawings such that like reference numerals refer to like elements and in which:

FIG. 1 illustrates a side view of a first embodiment of a CMOS integrated circuit structure at a first contact creation stage in accordance with embodiments of the present disclosure;

FIG. 2 illustrates a side view of the first embodiment of the CMOS integrated circuit structure of FIG. 1 at a second contact creation stage in accordance with embodiments of the present disclosure;

FIG. 5 illustrates a side view of the first embodiment of the CMOS integrated circuit structure of FIG. 1 at a fifth contact creation stage in accordance with embodiments of the present disclosure;

FIG. 6 illustrates a side view of the first embodiment of the CMOS integrated circuit structure of FIG. 1 at a sixth contact creation stage in accordance with embodiments of the present disclosure;

FIG. 7 illustrates a side view of a gate contact region of a gate conductor of a CMOS integrated circuit structure in accordance with embodiments of the present disclosure;

FIG. 8 illustrates a side view of a conductive cap of embodiments of a CMOS integrated circuit structure 100 in accordance with embodiments of the present disclosure;

FIG. 12 illustrates a side view of the second embodiment of the CMOS integrated circuit structure of FIG. 10 at a third contact creation stage in accordance with embodiments of the present disclosure;

FIG. 13 illustrates a side view of the second embodiment of the CMOS integrated circuit structure of FIG. 10 at a fourth contact creation stage in accordance with embodiments of the present disclosure;

FIG. 19 illustrates a side view of the third embodiment of the CMOS integrated circuit structure of FIG. 17 at a third contact creation stage in accordance with embodiments of the present disclosure;

FIG. 20 illustrates a side view of the third embodiment of the CMOS integrated circuit structure of FIG. 17 at a fourth contact creation stage in accordance with embodiments of the present disclosure;

FIG. 21 illustrates a side view of the third embodiment of the CMOS integrated circuit structure of FIG. 17 at a fifth contact creation stage in accordance with embodiments of the present disclosure;

FIG. 22 illustrates a side view of the third embodiment of the CMOS integrated circuit structure of FIG. 17 at a sixth contact creation stage in accordance with embodiments of the present disclosure;

FIG. 24 illustrates a side view of a fourth embodiment of a CMOS integrated circuit structure at a first contact creation stage in accordance with embodiments of the present disclosure;

FIG. 25 illustrates a side view of the fourth embodiment of the CMOS integrated circuit structure of FIG. 24 at a second contact creation stage in accordance with embodiments of the present disclosure;

FIG. 28 illustrates a side view of the fourth embodiment of the CMOS integrated circuit structure of FIG. 24 at a fifth contact creation stage in accordance with embodiments of the present disclosure;

FIG. 30 illustrates a side view of a fifth embodiment of a CMOS integrated circuit structure at a first contact creation stage in accordance with embodiments of the present disclosure;

FIG. 31 illustrates a side view of the fifth embodiment of the CMOS integrated circuit structure of FIG. 30 at a second contact creation stage in accordance with embodiments of the present disclosure;

DETAILED DESCRIPTION

Figure 3:
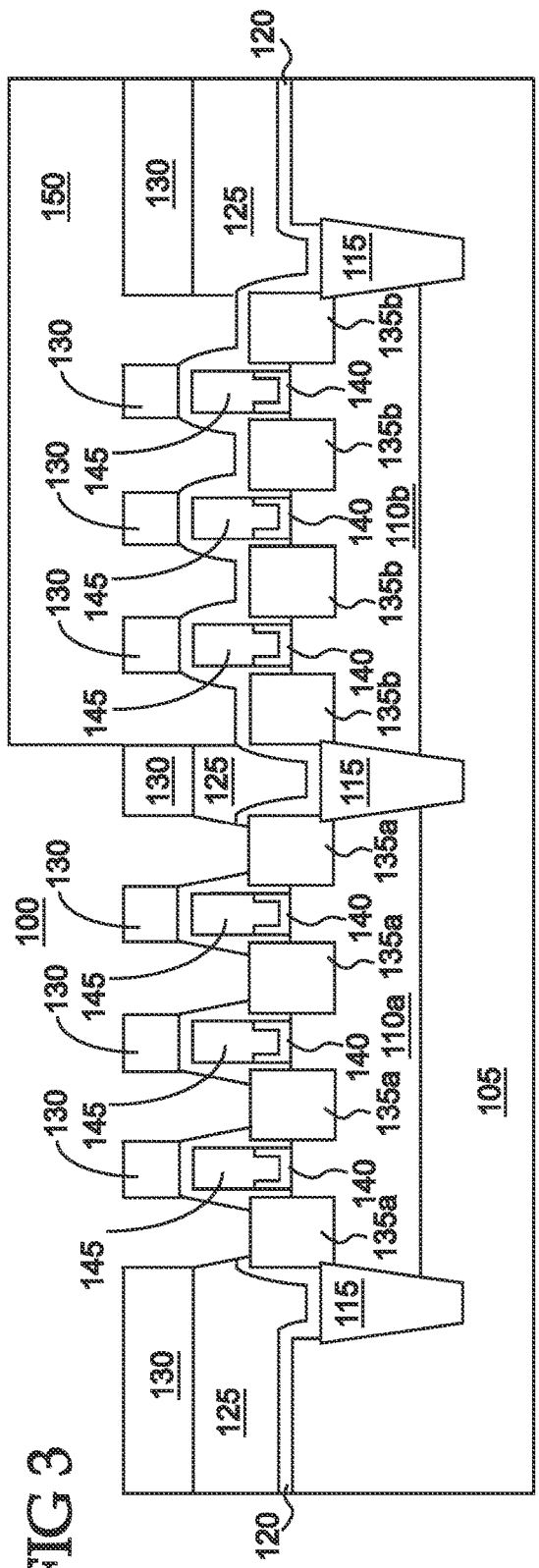
FIG. 3 illustrates a side view of the first embodiment of the CMOS integrated circuit structure of FIG. 1 at a third contact creation stage in accordance with embodiments of the present disclosure.

For simplicity and clarity of illustration, reference numerals may be repeated among the figures to indicate corresponding or analogous elements. The sizes and relative positions of elements in the drawings are not necessarily drawn to scale. Numerous details are set forth to provide an understanding of the illustrative embodiments described herein. The embodiments may be practiced without these details. In other instances, well-known methods, procedures, and components have not been described in detail to avoid obscuring the disclosed embodiments. The description is not to be considered as limited to the scope of the exemplary embodiments shown and described herein.

The terms "a" or "an", as used herein, are defined as one or more than one. The term "plurality", as used herein, is defined as two or more than two. The term "another", as used herein, is defined as at least a second or more. The terms "including" and/or "having", as used herein, are defined as comprising (i.e., open language). The term "coupled", as used herein, is defined as connected, although not necessarily directly, and not necessarily mechanically. The term "or" as used herein is to be interpreted as an inclusive or meaning any one or any combination. Therefore, "A, B or C" means "any of the following: A; B; C; A and B; A and C; B and C; A, B and C". An exception to this definition will occur only when a combination of elements, functions, steps or acts are in some way inherently mutually exclusive.

Reference throughout this document to "one embodiment", "certain embodiments", "an embodiment", "an example", "an implementation", "an example" or similar terms means that a particular feature, structure, or characteristic described in connection with the embodiment, example or implementation is included in at least one embodiment, example or implementation of the present invention. Thus, the appearances of such phrases or in various places throughout this specification are not necessarily all referring to the same embodiment, example or implementation. Furthermore, the particular features, structures, or characteristics may be combined in any suitable manner in one or more embodiments, examples or implementations without limitation.

Unless the context requires otherwise, throughout the specification and claims that follow, the word "comprise" and variations thereof, such as "comprises" and "comprising" are to be construed in an open, inclusive sense, that is, as "including, but not limited to."

As shown in the drawings for purposes of illustration, novel techniques are disclosed herein for integrated circuit via structures and methods for the fabrication of integrated circuit via structures. Via structure patterning schemes are disclosed which can be used in a single or a double via structure patterning process.

While the continuing trend toward manufacturing integrated circuits with higher component densities offers advantages in both faster circuit performance and in lower fabrication costs, the smaller feature sizes also have resulted in smaller cross-sectional device contact areas and associated larger contact resistances. In particular, for metal oxide semiconductor integrated circuits, as for example Complementary Metal-Oxide-Semiconductor (CMOS) integrated circuits, contact resistance is now a very important parameter. Currently the contact resistances for p-channel field-effect transistors (pFETs) are approximately 3E-9 ohm/cm2 while that for n-channel field-effect transistors (nFETs) is considerably higher at approximately 1E-8 ohm/cm2.

An important parameter in selecting appropriate materials for forming contacts to the sources and drains of the pFETs and of the nFETs is the Schottky barrier heights of those materials to the heavily doped source and drain regions. A material having a lower Schottky barrier height to the heavily p-doped sources and drains of the pFETs should result in a lower contact resistance for the pFETs, and a material having a lower Schottky barrier height to the heavily n-doped sources and drains of the nFETs should result in a lower contact resistance for the nFETs. The barrier height of titanium silicide ($TiSi_2$) to n-doped silicon is 0.58 electron-volts (eV) while that of nickel silicide ($NiSi_2$) is 0.66 eV, and it has been found that titanium silicide makes a better conductive interface to nFETs than does nickel silicide. However, the barrier height of titanium silicide ($TiSi_2$) to p-doped silicon is 0.48 electron-volts (eV) while that of nickel silicide ($NiSi_2$) to p-doped silicon is 0.4 eV. As discussed herein Nickel silicide has been determined to make a better conductive interface to pFETs than does titanium silicide.

Processes for CMOS integrated circuits that create separate silicide contact interface types for p-channel metal-oxide-semiconductor field-effect transistors (pFETs) and for n-channel metal-oxide-semiconductor field-effect transistors (nFETs) and associated CMOS integrated circuit structures embodying these separate silicide contact interface types for pFETs and for nFETs are disclosed herein. These separate silicide contact interface types provide reduced contact resistances at the pFET source and drain interfaces while maintaining low contact resistances at the nFET source and drain interfaces, thereby improving switching speeds of the CMOS components. As will be shown, these processes create $NiSi_2$ interfaces at the p-doped silicon source and drain regions of the pFETs and $TiSi_2$ interfaces at the n-doped silicon source and drain regions of the nFETs.

The CMOS integrated circuit structures having low resistance contacts and their method of fabrication are illustrated and discussed herein in terms of sidewall image transfer processes, but the low resistance contact structures and their method of fabrication are not limited to such processes. Sidewall image transfer processes which are also referred to as spacer image transfer processes use a technique used to circumvent the limitations of current photolithographic processes which is referred to as spacer lithography. Following the patterning of a sacrificial layer in such processes, a layer of hard masking material is conformally deposited and then anisotropically etched. This processing ideally results in leaving only a vertical layer of the hard masking material on the sidewalls of the patterned sacrificial layer. The sacrificial layer is then removed, certain areas of the hard masking material are removed, and subsequently the pattern defined by the vertical layers of hard masking material are etched into an underlying layer. The result is a critical dimension which is less than the critical dimension of the photolithographic process alone and which is now dependent upon the thickness of the conformal layer. A blocking photolithographic mask is used in sidewall image transfer processes following sidewall creation to block off areas of the circuitry from subsequent etching of the sidewall defined openings into a lower hard layer.

FIG. 1 illustrates a side view of a first embodiment of a CMOS integrated circuit structure 100 at a first contact creation stage in accordance with embodiments of the present disclosure. In FIG. 1, an n-type well 110a and a p-type well 110b overlay and are embedded in a substrate 105. The n-type well 110a and the p-type well 110b are isolated from one another by isolation regions 115. Also embedded in the n-type well 110a are pFET source-drains 135a, and embedded in the p-type well 110b are nFET source-drains 135b. Gate dielectrics 140 overlay the gate regions between adjacent pFET source-drains 135a and between adjacent nFET source-drains 135b. Overlaying the gate dielectrics 140 are gate conductors 145. The elements of the gate conductors 145 are described with the discussion of and shown more fully in FIG. 7. In various locations on the CMOS integrated circuit structure 100 overlaying the substrate 105, the isolation regions 115, the pFET source-drains 135a, the nFET source-drains 135b, and the gate conductor 145 is a protective layer 120 which can function as an etch stop layer 120. Overlaying the protective layer 120 is a first overlaying insulation layer 125, and overlaying the first overlaying insulation layer 125 is an second overlaying insulation layer 130. As used herein the element pFET source-drain 135a refers to the source and/or the drain of a pFET 180, i.e., a p-channel field-effect transistor 180, and the element nFET source-drain 135b refers to the source and/or the drain of an nFET 185, i.e., an n-channel field-effect transistor 185. For clarity and ease of illustration, the nFETs 180 and pFETs 185 of the first embodiment are so indicated only on FIG. 1 but are similarly located on FIGS. 2-6.

The CMOS integrated circuit structure 100 could be fabricated using well know integrated circuit processes. The material of the substrate 105 could be, for example, silicon or other appropriate material; the n-type well 110a could be created by, for example, appropriate masking followed by diffusion of an n-type dopant such as arsenic, phosphorus or other appropriate material into a region of the silicon substrate 105 or by another appropriate method; the p-type well 110b could be created by, for example, appropriate masking followed by diffusion of a p-type dopant such as boron or other appropriate material into a region of the silicon substrate 105 or by another appropriate method; the isolation regions 115 could be created by, for example, appropriate masking followed by etching the substrate, filling with silicon dioxide and a chemical mechanical planarization (CMP) process or other appropriate method; the protective layer 120 could be created by, for example, chemical vapour deposition of silicon nitride or other appropriate material or by another appropriate method; the first overlaying insulation layer 125 could be created by, for example, chemical vapour deposition of silicon dioxide or other appropriate material or by another appropriate method; the second overlaying insulation layer 130 could be created by, for example, chemical vapour deposition of silicon dioxide or other appropriate material or by another appropriate method; the pFET source-drains 135a could be created by, for example, appropriate masking followed by chemical vapour deposition of boron doped silicon-germanium or other appropriate material into the n-type wells 110a or by another appropriate method; the nFET source-drains 135b could be created by, for example, appropriate masking followed by chemical vapour deposition of arsenic doped silicon, silicon carbide, or other appropriate material into the p-type wells 110b or by another appropriate method; the gate dielectrics 140 over the n-type wells 110a and the p-type wells 110b could be created by, for example, appropriate masking followed by the chemical vapour deposition of hafnium oxide ($HfO_2$) or other appropriate material or by another appropriate method.

FIG. 2 illustrates a side view of the first embodiment of the CMOS integrated circuit structure 100 of FIG. 1 at a second contact creation stage in accordance with embodiments of the present disclosure. Prior to the view of FIG. 2, photoresist is appropriately applied, patterned, and developed over the CMOS integrated circuit structure 100 of FIG. 1 and is then etched using carbon tetrafluoride ($CF_4$) or other appropriate material or by another appropriate method until the protective layer 120 is reached.

FIG. 3 illustrates a side view of the first embodiment of the CMOS integrated circuit structure 100 of FIG. 1 at a third contact creation stage in accordance with embodiments of the present disclosure. Prior to the view of FIG. 3, a photoresist layer 150 is appropriately applied, patterned, and developed over the CMOS integrated circuit structure 100 of FIG. 1 leaving that part of the photoresist layer 150 generally over the p-type well 110b region as shown in FIG. 3. The exposed protective layer 120 is then removed which removal could be effected by fluoroform ($CHF_3$) or other appropriate material or by another appropriate method.

Figure 4:
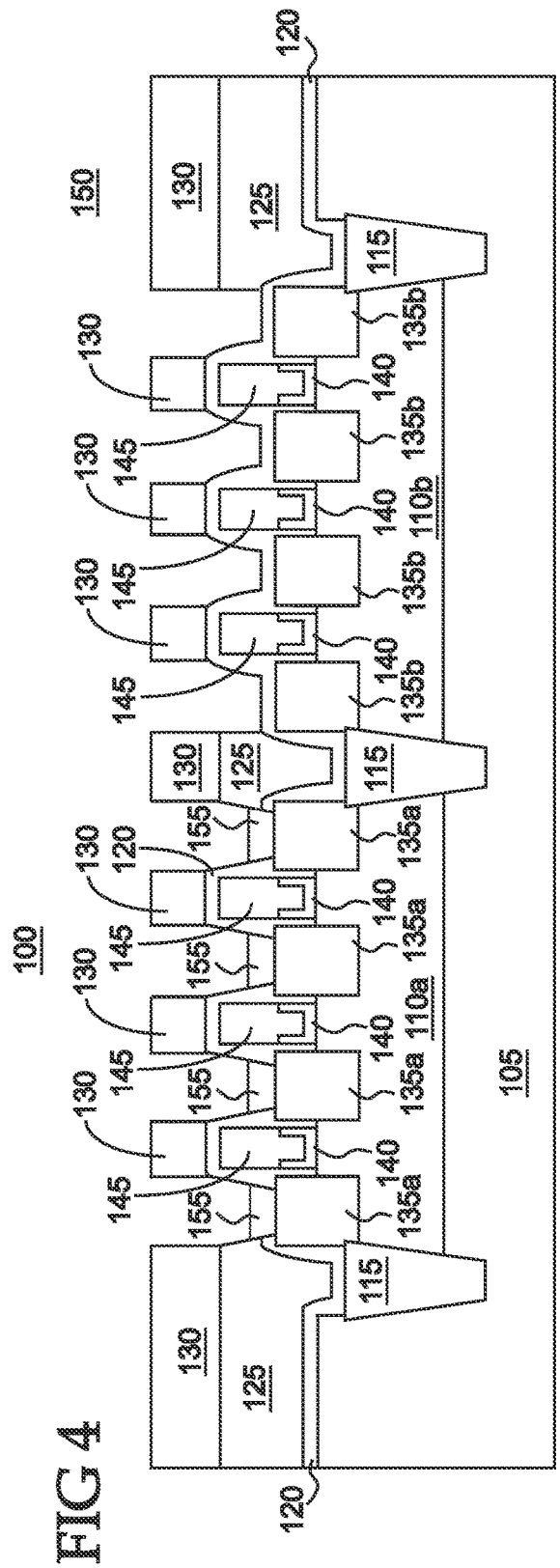
FIG. 4 illustrates a side view of the first embodiment of the CMOS integrated circuit structure of FIG. 1 at a fourth contact creation stage in accordance with embodiments of the present disclosure.

FIG. 4 illustrates a side view of the first embodiment of the CMOS integrated circuit structure 100 of FIG. 1 at a fourth contact creation stage in accordance with embodiments of the present disclosure. Prior to the view of FIG. 4, the photoresist layer 150 is removed, and then the pFET contact 155 which could be a nickel silicide material is formed on the pFET source-drains 135a which could be formed by a deposition of nickel platinum (NiPt) over the top of the structure 100 followed by an anneal process. During the anneal the exposed silicon areas react with the NiPt to form a nickel silicide. A final wet clean step then removes all non-reacted NiPt.

FIG. 5 illustrates a side view of the first embodiment of the CMOS integrated circuit structure 100 of FIG. 1 at a fifth contact creation stage in accordance with embodiments of the present disclosure. Prior to the view of FIG. 5, the protective layer 120 which remains over the nFET source-drains 135b is removed. The protective layer 120 remaining over the nFET source-drains 135b could be removed by etching with $CHF_3$. On the pFET side, the nickel silicide of the pFET contact 155 is not attacked by the $CHF_3$ etch.

FIG. 6 illustrates a side view of the first embodiment of the CMOS integrated circuit structure 100 of FIG. 1 at a sixth contact creation stage in accordance with embodiments of the present disclosure. Prior to the view of FIG. 6, in a representative embodiment source-drain conductive caps 160 are created over both the pFET contacts 155 which are over the pFET source-drains 135a and the nFET source-drains 135b. The conductive caps 160 could be formed as shown in FIG. 8 wherein the conductive caps 160 could each comprise a first cap component 161, a second cap component 162, and a third cap component 163. The first cap components 161 could be formed by a deposition of titanium; the second cap components 162 could be formed by a deposition of titanium nitride; and the third cap components 163 could be formed by a deposition of tungsten. nFET contacts 165 comprising a titanium silicide material could be formed over the nFET source-drains 135b during the formation of the conductive caps 160 without additional processing steps.

FIG. 7 illustrates a side view of a gate contact region of a gate conductor 145 of a CMOS integrated circuit structure 100 in accordance with embodiments of the present disclosure. The gate conductor 145 comprises a first gate-conductor layer which could be formed, for example, by the deposition of titanium or other appropriate method and/or material, a second gate-conductor layer 147 which could be formed, for example, by the deposition of titanium nitride or other appropriate method and/or material over the first gate-conductor layer 146, and a third gate-conductor layer 148 which could be formed, for example, by the deposition of tungsten or other appropriate method and/or material over the second gate-conductor layer 147.

FIG. 8 illustrates a side view of a conductive cap 160 of embodiments of a CMOS integrated circuit structure 100 in accordance with embodiments of the present disclosure. As described above in reference to FIG. 6, a conductive cap 160 could comprise a first cap component 161, a second cap component 162, and a third cap component 163. The first cap component 161 could be formed by a deposition of titanium; the second cap component 162 could be formed by a deposition of titanium nitride; and the third cap component 163 could be formed by a deposition of tungsten.

Figure 9:
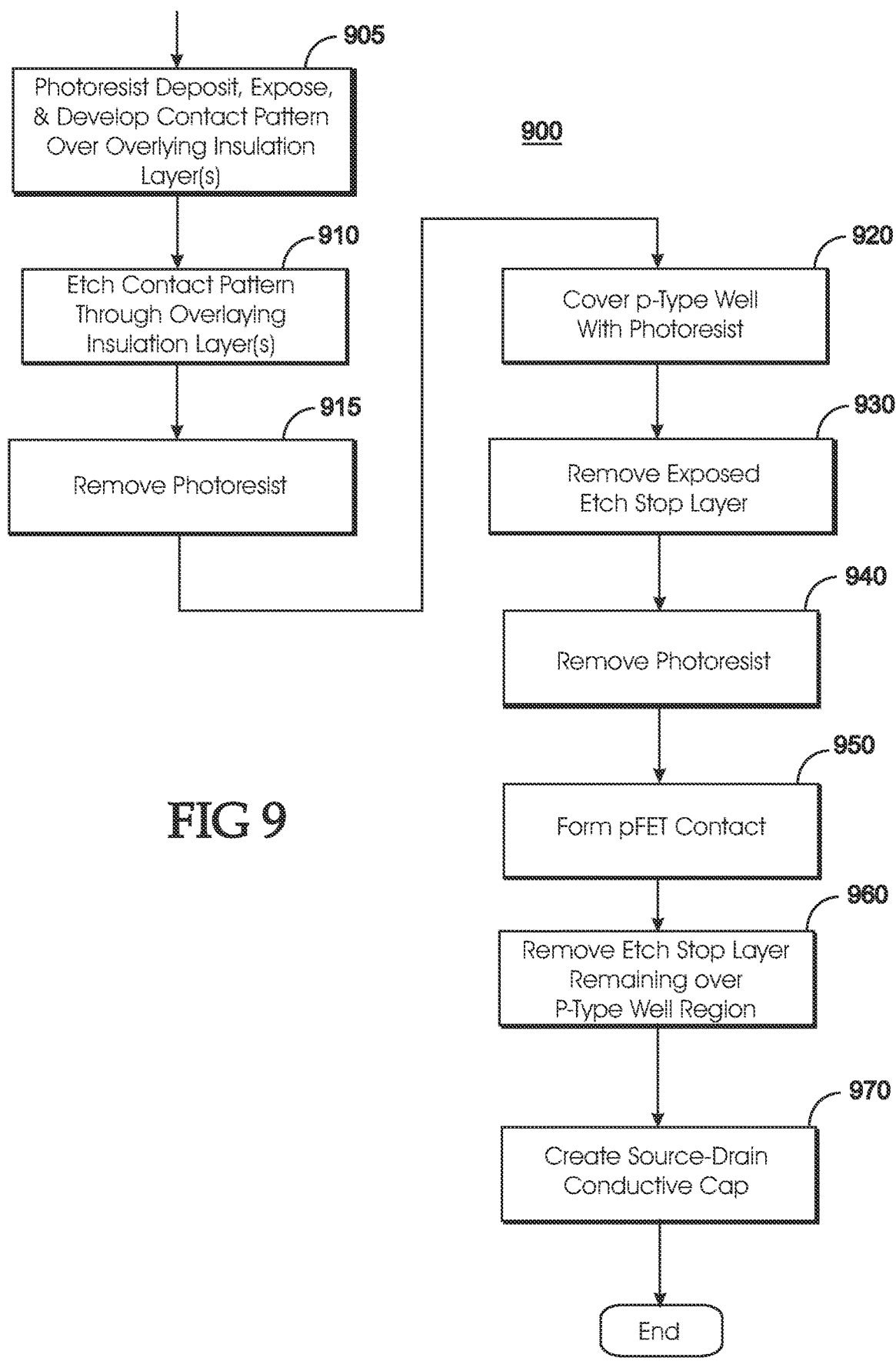
FIG. 9 illustrates a flow chart of a first method for contact creation in the first embodiment of the CMOS integrated circuit structure of FIG. 1 in accordance with embodiments of the present disclosure.

FIG. 9 illustrates a flow chart of a first method 900 for contact creation in the first embodiment of the CMOS integrated circuit structure 100 of FIG. 1 in accordance with embodiments of the present disclosure. In block 905 of FIG. 9, photoresist is deposited over any overlaying insulation layers which could, for example, comprise the first overlaying insulation layer 125 and the second overlaying insulation layer 130. The photoresist is then exposed and developed to pattern regions for the contacts in the photoresist. Block 905 then transfers control to block 910.

In block 910 the overlaying insulation layers are etched until the protective layer 120 is reached. Block 910 then transfers control to block 915.

In block 915, the photoresist overlaying the insulation layers is removed. Block 915 then transfers control to block 920.

In block 920, photoresist is deposited, exposed, and developed leaving a photoresist layer 150 overlaying the p-type wells 110b. Block 920 then transfers control to block 930.

In block 930, the exposed protective layer 120 is removed which removal could be effected by etching with fluoroform ($CHF_3$) or other appropriate material or by another appropriate method. Block 930 then transfers control to block 940.

In block 940, the photoresist layer 150 overlaying the p-type well 110b regions is removed. Block 940 then transfers control to block 950.

In block 950, the pFET contact 155 which could be a nickel silicide material is formed on the pFET source-drains 135a which could be formed by a deposition of nickel platinum (NiPt) over the top of the structure 100 followed by an anneal process. During the anneal the exposed silicon areas react with the NiPt to form nickel silicide. A final wet clean step then removes all non-reacted NiPt. Block 950 then transfers control to block 960.

In block 960, the protective layer 120 remaining over the nFET source-drain 135b is removed. This remaining protective layer 120 could be removed by etching with $CHF_3$. On the pFET side, the nickel silicide of the pFET contact 155 is not attacked by the $CHF_3$ etch. Block 960 then transfers control to block 970.

In block 970, source-drain conductive caps 160 are created over both the pFET contacts 155 which are over the pFET source-drains 135a and the nFET source-drains 135b. The conductive caps 160 could be formed as shown in FIG. 8 wherein the conductive caps 160 could each comprise a first cap component 161, a second cap component 162, and a third cap component 163. The first cap component 161 could be formed by a deposition of titanium; the second cap component 162 could be formed by a deposition of titanium nitride; and the third cap component 163 could be formed by a deposition of tungsten. An nFET contact 165 comprising a titanium silicide material could be formed over the nFET source-drains 135b during the formation of the conductive caps 160 without additional processing steps. Block 970 then terminates the process.

Figure 10:
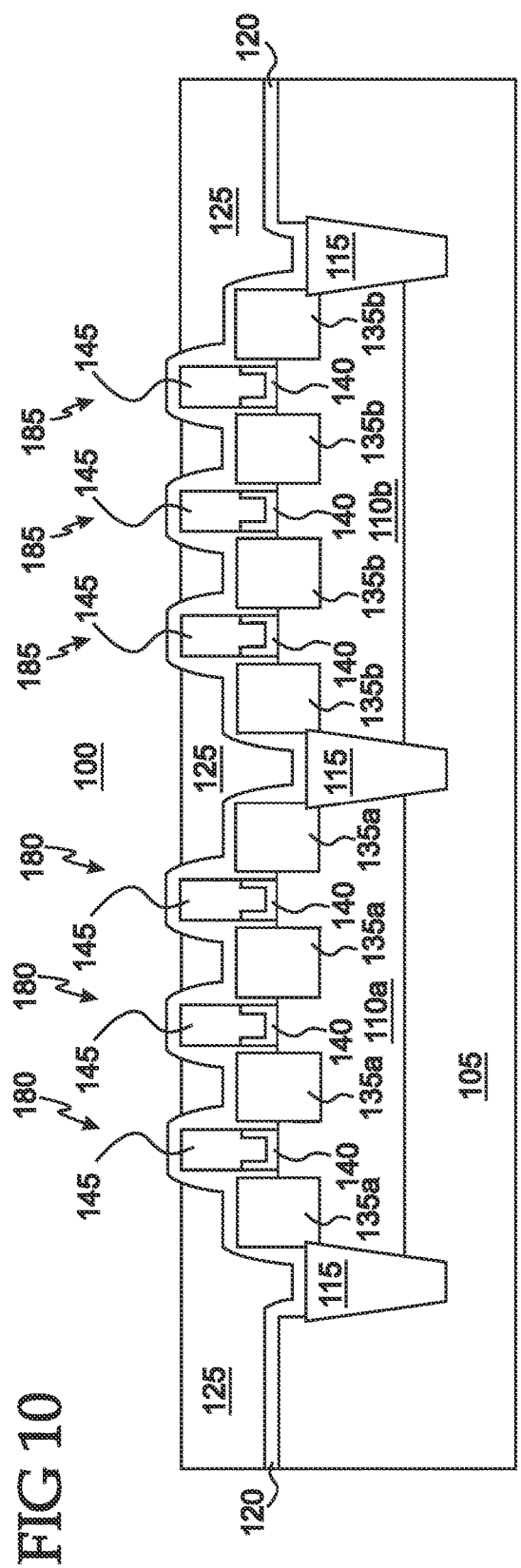
FIG. 10 illustrates a side view of a second embodiment of a CMOS integrated circuit structure at a first contact creation stage in accordance with embodiments of the present disclosure.

FIG. 10 illustrates a side view of a second embodiment of a CMOS integrated circuit structure 100 at a first contact creation stage in accordance with embodiments of the present disclosure. In FIG. 10, an n-type well 110a and a p-type well 110b overlay and are embedded in a substrate 105. The n-type well 110a and the p-type well 110b are isolated from one another by isolation regions 115. Also embedded in the n-type well 110a are pFET source-drains 135a, and embedded in the p-type well 110b are nFET source-drains 135b. Gate dielectrics 140 overlay the gate regions between adjacent pFET source-drains 135a and between adjacent nFET source-drains 135b. Overlaying the gate dielectrics 140 are gate conductors 145. The elements of the gate conductors 145 are described with the discussion of and shown more fully in FIG. 7. In various locations on the CMOS integrated circuit 100 overlaying the substrate 105, the isolation regions 115, the pFET source-drains 135a, the nFET source-drains 135b, and the gate conductor 145 is a protective layer 120. Overlaying the protective layer 120 is a first overlaying insulation layer 125. As used herein the element pFET source-drain 135a refers to the source and/or the drain of a pFET 180, i.e., a p-channel field-effect transistor 180, and the element nFET source-drain 135b refers to the source and/or the drain of an nFET 185, i.e., an n-channel field-effect transistor 185. For clarity and ease of illustration, the nFETs 180 and pFETs 185 of the second embodiment are so indicated only on FIG. 10 but are similarly located on FIGS. 11-15.

The CMOS integrated circuit structure 100 could be fabricated using well know integrated circuit processes. The material of the substrate 105 could be, for example, silicon or other appropriate material; the n-type well 110a could be created by, for example, appropriate masking followed by diffusion of an n-type dopant such as arsenic, phosphorus or other appropriate material into a region of the silicon substrate 105 or by another appropriate method; the p-type well 110b could be created by, for example, appropriate masking followed by diffusion of a p-type dopant such as boron or other appropriate material into a region of the silicon substrate 105 or by another appropriate method; the isolation regions 115 could be created by, for example, appropriate masking followed by etching the substrate, filling with silicon dioxide and a chemical mechanical planarization (CMP) process or other appropriate method; the protective layer 120 could be created by, for example, chemical vapour deposition of silicon nitride or other appropriate material or by another appropriate method; the first overlaying insulation layer 125 could be created by, for example, chemical vapour deposition of silicon dioxide or other appropriate material or by another appropriate method; the pFET source-drains 135a could be created by, for example, appropriate masking followed by chemical vapour deposition of boron doped silicon-germanium or other appropriate material into the n-type wells 110a or by another appropriate method; the nFET source-drains 135b could be created by, for example, appropriate masking followed by chemical vapour deposition of arsenic doped silicon, silicon carbide, or other appropriate material into the p-type wells 110b or by another appropriate method; the gate dielectrics 140 over the n-type wells 110a and the p-type wells 110b could be created by, for example, appropriate masking followed by the chemical vapour deposition of hafnium oxide ($HfO_2$) or other appropriate material or by another appropriate method.

Figure 11:
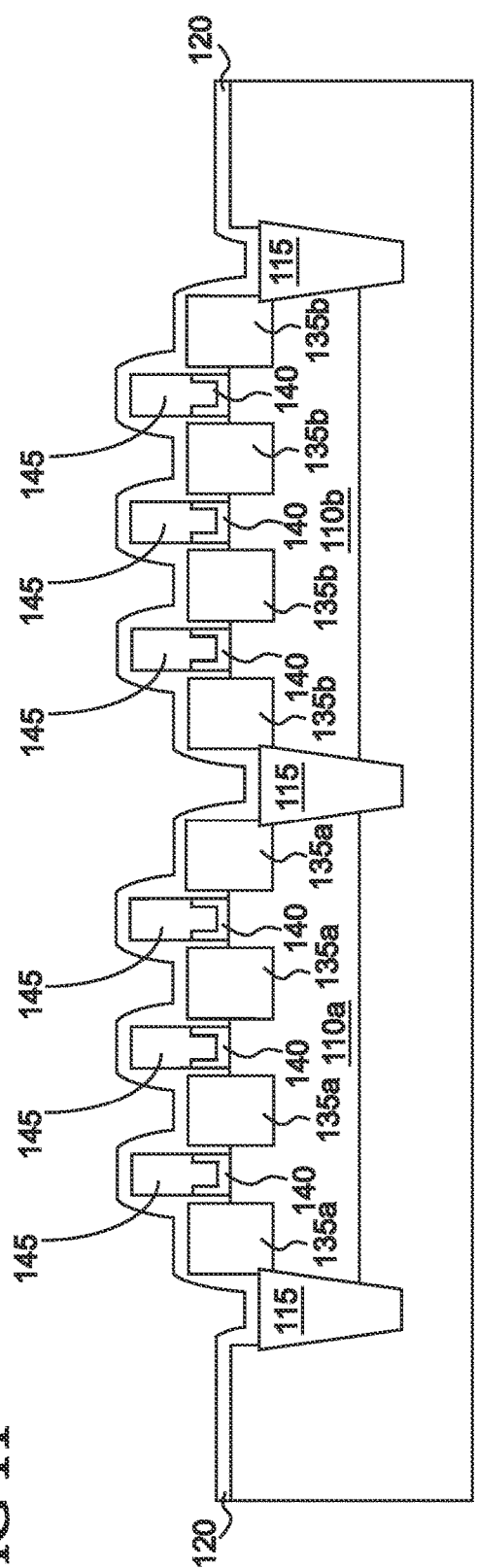
FIG. 11 illustrates a side view of the second embodiment of the CMOS integrated circuit structure of FIG. 10 at a second contact creation stage in accordance with embodiments of the present disclosure.

FIG. 11 illustrates a side view of the second embodiment of the CMOS integrated circuit structure 100 of FIG. 10 at a second contact creation stage in accordance with embodiments of the present disclosure. Prior to the view of FIG. 11, the first overlaying insulation layer 125 is removed via a highly selective oxide removal process.

FIG. 12 illustrates a side view of the second embodiment of the CMOS integrated circuit structure 100 of FIG. 10 at a third contact creation stage in accordance with embodiments of the present disclosure. Prior to the view of FIG. 12, a photoresist layer 150 is appropriately applied, patterned, and developed over the CMOS integrated circuit structure 100 of FIG. 10 leaving that part of the photoresist layer 150 generally over the p-type well 110b region as shown in FIG. 3. The exposed protective layer 120 is then removed which removal could be effected by fluoroform ($CHF_3$) or other appropriate material or by another appropriate method. However, some thicker or more protected portions of the exposed protective layer 120 may remain, for example, as indicated in FIG. 12.

FIG. 13 illustrates a side view of the second embodiment of the CMOS integrated circuit structure 100 of FIG. 10 at a fourth contact creation stage in accordance with embodiments of the present disclosure. Prior to the view of FIG. 13, the photoresist layer 150 is removed, and then the pFET contact 155 which could be a nickel silicide material is formed on the pFET source-drains 135a which could be formed by a deposition of nickel platinum (NiPt) over the top of the structure 100 followed by an anneal process. During the anneal the exposed silicon areas react with the NiPt to form a nickel silicide. A final wet clean step then removes all non-reacted NiPt.

Figure 14:
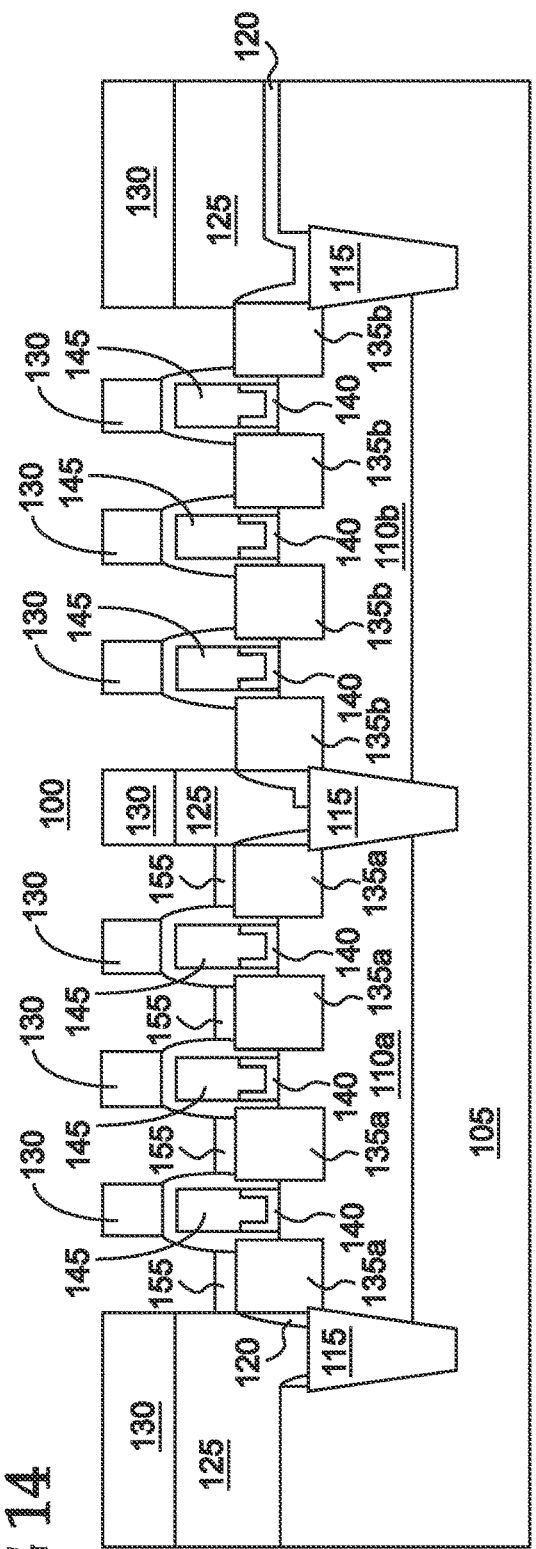
FIG. 14 illustrates a side view of the second embodiment of the CMOS integrated circuit structure of FIG. 10 at a fifth contact creation stage in accordance with embodiments of the present disclosure.

FIG. 14 illustrates a side view of the second embodiment of the CMOS integrated circuit structure 100 of FIG. 10 at a fifth contact creation stage in accordance with embodiments of the present disclosure. Prior to the view of FIG. 14, a first overlaying insulation layer 125 is created over the CMOS integrated circuit structure 100 of FIG. 13 followed by a second overlaying insulation layer 130 formed overlaying the first overlaying insulation layer 125. The first overlaying insulation layer 125 could be created by, for example, chemical vapour deposition of silicon dioxide or other appropriate material or by another appropriate method, and the second overlaying insulation layer 130 could be created by, for example, chemical vapour deposition of silicon dioxide or other appropriate material or by another appropriate method. Photoresist is then deposited over this structure. Subsequently the photoresist is exposed and developed to pattern the contact regions in the photoresist. The overlaying insulation layers are etched until the pFET and nFET contacts 155 and the n-FET source-drains 135b are reached. Finally the remaining photoresist is removed.

Figure 15:
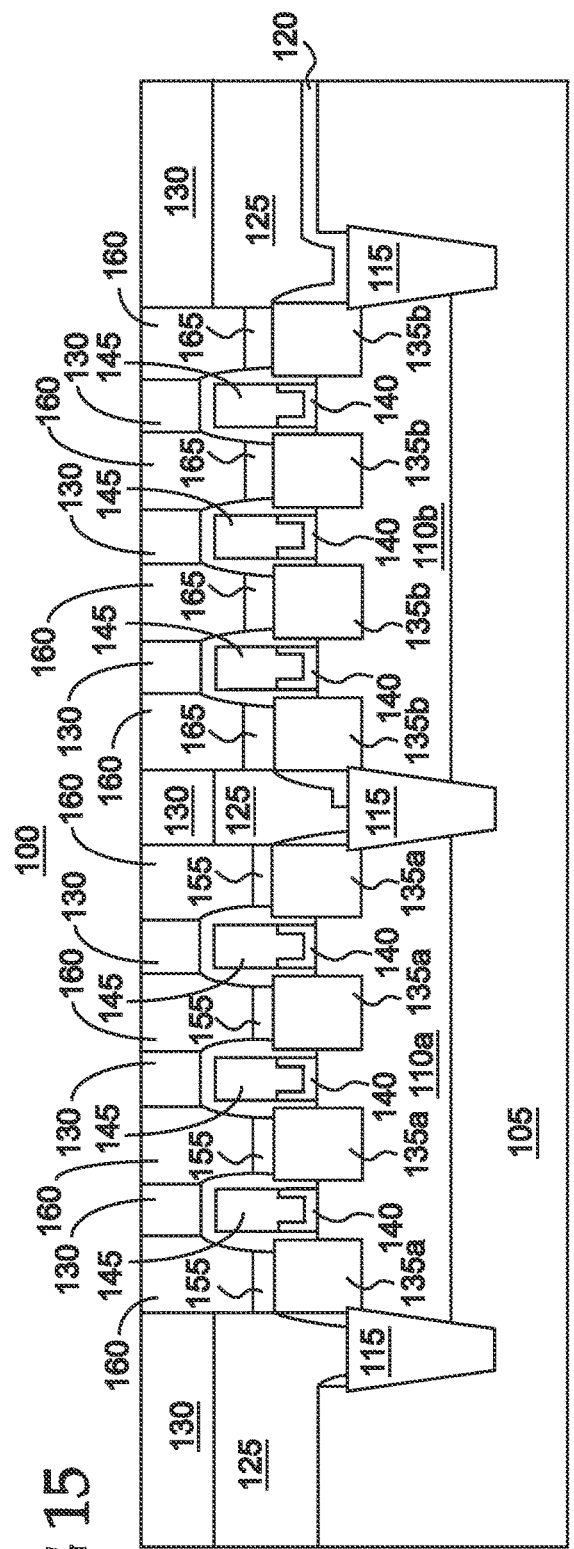
FIG. 15 illustrates a side view of the second embodiment of the CMOS integrated circuit structure of FIG. 10 at a sixth contact creation stage in accordance with embodiments of the present disclosure.

FIG. 15 illustrates a side view of the second embodiment of the CMOS integrated circuit structure 100 of FIG. 10 at a sixth contact creation stage in accordance with embodiments of the present disclosure. Prior to the view of FIG. 15, in a representative embodiment source-drain conductive caps 160 are created over both the pFET contacts 155 which are over the pFET source-drains 135a and the nFET source-drains 135b. The conductive caps 160 could be formed as shown in FIG. 8 wherein the conductive caps 160 could each comprise a first cap component 161, a second cap component 162, and a third cap component 163. The first cap components 161 could be formed by a deposition of titanium; the second cap components 162 could be formed by a deposition of titanium nitride; and the third cap components 163 could be formed by a deposition of tungsten.

nFET contacts 165 comprising a titanium silicide material could be formed over the nFET source-drains 135b during the formation of the conductive caps 160 without additional processing steps.

Figure 16:
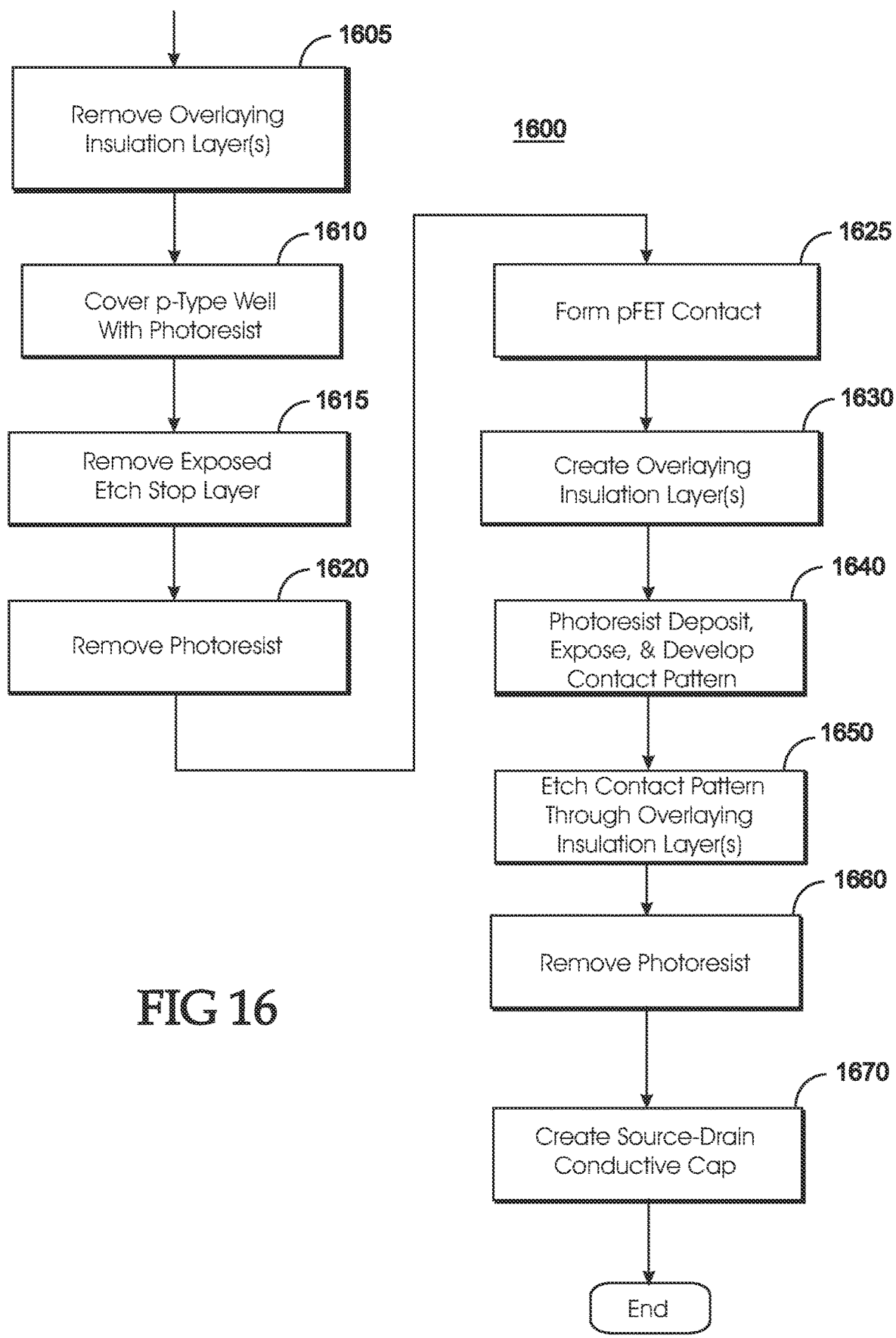
FIG. 16 illustrates a flow chart of a second method for contact creation in the first embodiment of the CMOS integrated circuit structure of FIG. 10 in accordance with embodiments of the present disclosure.

FIG. 16 illustrates a flow chart of a second method 1600 for contact creation in the first embodiment of the CMOS integrated circuit structure 100 of FIG. 10 in accordance with embodiments of the present disclosure. In block 1605 of FIG. 16 any overlaying insulation layers, for example, the first overlaying insulation layer 125 is removed. Block 1605 then transfers control to block 1610.

In block 1610 photoresist is deposited, exposed, and developed leaving a photoresist layer 150 overlaying the p-type wells 110b. Block 1610 then transfers control to block 1615.

In block 1615, the exposed protective layer 120 is removed which removal could be effected by etching with fluoroform ($CHF_3$) or other appropriate material or by another appropriate method. Block 1615 then transfers control to block 1620.

In block 1620, the photoresist overlaying the p-type well 110b regions is removed. Block 1620 then transfers control to block 1625.

In block 1625, pFET contacts 155 which material could be a nickel silicide material are formed on the pFET source-drains 135a which could be formed by a deposition of nickel platinum (NiPt) over the top of the structure 100 followed by an anneal process. During the anneal the exposed silicon areas react with the NiPt to form nickel silicide. A final wet clean step then removes all non-reacted NiPt. Block 1620 then transfers control to block 1630.

In block 1630, one or more overlaying insulation layers, for example, the first overlaying insulation layer 125 is formed over the CMOS integrated circuit structure 100. Block 1630 then transfers control to block 1640.

In block 1640, photoresist is deposited over any overlaying insulation layers which could, for example, comprise the first overlaying insulation layer 125 and/or the second overlaying insulation layer 130. The photoresist is then exposed and developed to pattern the contact regions in the photoresist. Block 1640 then transfers control to block 1650.

In block 1650, the overlaying insulation layers are etched until the protective layer 120 is reached. Block 1650 then transfers control to block 1660.

In block 1660, the photoresist overlaying the insulation layers is removed. Block 1660 then transfers control to block 1670.

In block 1670, source-drain conductive caps 160 are created over both the pFET contacts 155 which are over the pFET source-drains 135a and the nFET source-drains 135b. The conductive caps 160 could be formed as shown in FIG. 8 wherein the conductive caps 160 could each comprise a first cap component 161, a second cap component 162, and a third cap component 163. The first cap component 161 could be formed by a deposition of titanium; the second cap component 162 could be formed by a deposition of titanium nitride; and the third cap component 163 could be formed by a deposition of tungsten. An nFET contact 165 comprising a titanium silicide material could be formed over the nFET source-drains 135b during the formation of the conductive caps 160 without additional processing steps. Block 1670 then terminates the process.

Figure 17:
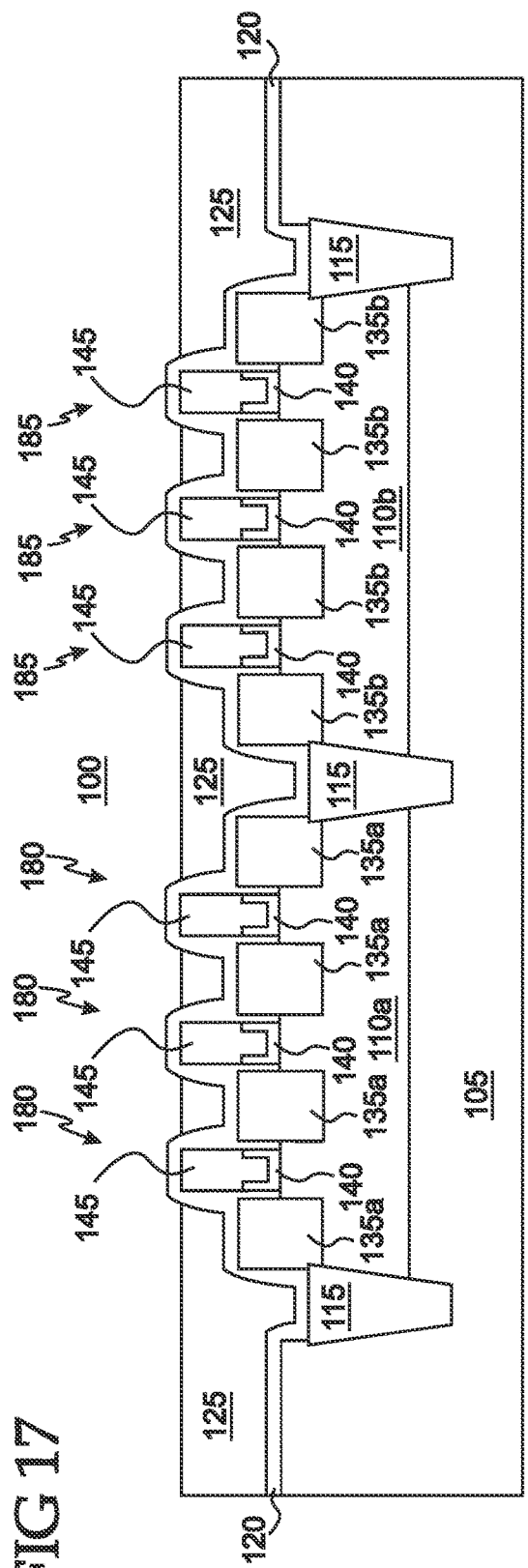
FIG. 17 illustrates a side view of a third embodiment of a CMOS integrated circuit structure 100 at a first contact creation stage in accordance with embodiments of the present disclosure.

FIG. 17 illustrates a side view of a third embodiment of a CMOS integrated circuit structure 100 at a first contact creation stage in accordance with embodiments of the present disclosure. In FIG. 17, an n-type well 110a and a p-type well 110b overlay and are embedded in a substrate 105. The n-type well 110a and the p-type well 110b are isolated from one another by isolation regions 115. Also embedded in the n-type well 110a are pFET source-drains 135a, and embedded in the p-type well 110b are nFET source-drains 135b. Gate dielectrics 140 overlay the gate regions between adjacent pFET source-drains 135a and between adjacent nFET source-drains 135b. Overlaying the gate dielectrics 140 are gate conductors 145. The elements of the gate conductors 145 are described with the discussion of and shown more fully in FIG. 7. In various locations on the CMOS integrated circuit structure 100 overlaying the substrate 105, the isolation regions 115, the pFET source-drains 135a, the nFET source-drains 135b, and the gate conductor 145 is a protective layer 120. Overlaying the protective layer 120 is a first overlaying insulation layer 125. As used herein the element pFET source-drain 135a refers to the source and/or the drain of a pFET 180, i.e., a p-channel field-effect transistor 180, and the element nFET source-drain 135b refers to the source and/or the drain of an nFET 185, i.e., an n-channel field-effect transistor 185. For clarity and ease of illustration, the nFETs 180 and pFETs 185 of the third embodiment are so indicated only on FIG. 17 but are similarly located on FIGS. 18-22.

The CMOS integrated circuit structure 100 could be fabricated using well know integrated circuit processes. The material of the substrate 105 could be, for example, silicon or other appropriate material; the n-type well 110a could be created by, for example, appropriate masking followed by diffusion of an n-type dopant such as arsenic, phosphorus or other appropriate material into a region of the silicon substrate 105 or by another appropriate method; the p-type well 110b could be created by, for example, appropriate masking followed by diffusion of a p-type dopant such as boron or other appropriate material into a region of the silicon substrate 105 or by another appropriate method; the isolation regions 115 could be created by, for example, appropriate masking followed by etching the substrate, filling with silicon dioxide and a chemical mechanical planarization (CMP) process or other appropriate method; the protective layer 120 could be created by, for example, chemical vapour deposition of silicon nitride or other appropriate material or by another appropriate method; the first overlaying insulation layer 125 could be created by, for example, chemical vapour deposition of silicon dioxide or other appropriate material or by another appropriate method; the pFET source-drains 135a could be created by, for example, appropriate masking followed by chemical vapour deposition of boron doped silicon-germanium or other appropriate material into the n-type wells 110a or by another appropriate method; the nFET source-drains 135b could be created by, for example, appropriate masking followed by chemical vapour deposition of arsenic doped silicon, silicon carbide, or other appropriate material into the p-type wells 110b or by another appropriate method; the gate dielectrics 140 over the n-type wells 110a and the p-type wells 110b could be created by, for example, appropriate masking followed by the chemical vapour deposition of hafnium oxide ($HfO_2$) or other appropriate material or by another appropriate method.

Figure 18:
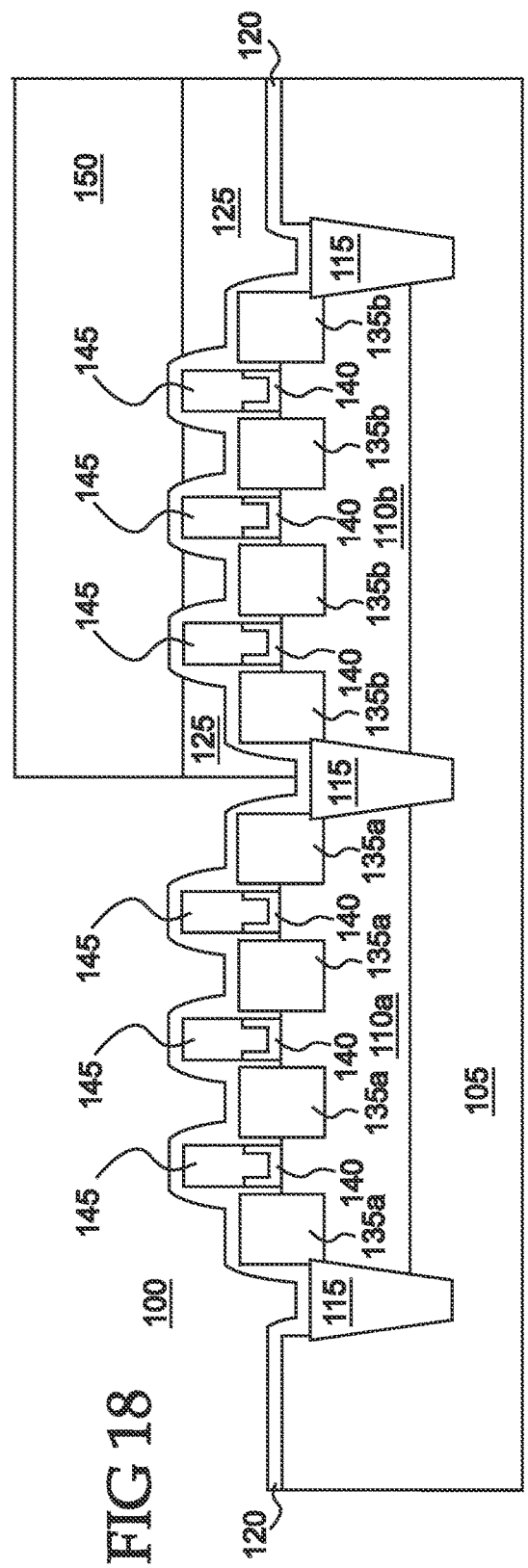
FIG. 18 illustrates a side view of the third embodiment of the CMOS integrated circuit structure of FIG. 17 at a second contact creation stage in accordance with embodiments of the present disclosure.

FIG. 18 illustrates a side view of the third embodiment of the CMOS integrated circuit structure 100 of FIG. 17 at a second contact creation stage in accordance with embodiments of the present disclosure. Prior to the view of FIG. 18, a photoresist layer 150 is appropriately applied, patterned, and developed over the CMOS integrated circuit structure 100 of FIG. 17 leaving that part of the photoresist layer 150 generally over the p-type well 110b region. Then the first overlaying insulation layer 125 is removed via a highly selective oxide removal process.

FIG. 19 illustrates a side view of the third embodiment of the CMOS integrated circuit structure 100 of FIG. 17 at a third contact creation stage in accordance with embodiments of the present disclosure. Prior to the view of FIG. 19, the photoresist layer 150 is removed. Then the exposed protective layer 120 is removed which removal could be effected by fluoroform ($CHF_3$) or other appropriate material or by another appropriate method. However, some thicker or more protected portions of the exposed protective layer 120 may remain, for example, as indicated in FIG. 19.

FIG. 20 illustrates a side view of the third embodiment of the CMOS integrated circuit structure 100 of FIG. 17 at a fourth contact creation stage in accordance with embodiments of the present disclosure. Prior to the view of FIG. 20, pFET contacts 155 which could be, for example, a nickel silicide material are formed on the pFET source-drains 135*a* which could be formed, for example, by a deposition of nickel platinum (NiPt) over the top of the structure 100 followed by an anneal process. During the anneal the exposed silicon areas react with the NiPt to form a nickel silicide. A final wet clean step then removes all non-reacted NiPt.

FIG. 21 illustrates a side view of the third embodiment of the CMOS integrated circuit structure 100 of FIG. 17 at a fifth contact creation stage in accordance with embodiments of the present disclosure. Prior to the view of FIG. 21, in a first alternative process the first overlaying insulation layer 125 is removed from the areas adjacent to and over the p-type well 110*b* of the CMOS integrated circuit structure 100 of FIG. 20 followed by a redeposit of the first overlaying insulation layer 125 over the CMOS integrated circuit structure 100. Then a chemical mechanical planarization process is applied which uses the protective layer 120 over of the gate conductors 145 as a stop layer. Finally a second overlaying insulation layer 130 is created overlaying the first overlaying insulation layer 125. Otherwise, in a second alternative process the first overlaying insulation layer 125 is created over the areas adjacent to and over the n-type well 110*a* of the CMOS integrated circuit structure 100 of FIG. 20 followed by a chemical mechanical planarization process is applied which uses the protective layer 120 over the gate conductors 145 as a stop layer. Finally a second overlaying insulation layer 130 is created overlaying the first overlaying insulation layer 125. The first overlaying insulation layer 125 could be created by, for example, chemical vapour deposition of silicon dioxide or other appropriate material or by another appropriate method, and the second overlaying insulation layer 130 could be created by, for example, chemical vapour deposition of silicon dioxide or other appropriate material or by another appropriate method. Photoresist is then deposited over this structure. Subsequently the photoresist is exposed and developed to pattern the contact regions in the photoresist. The overlaying insulation layers are etched until the pFET contacts 155 and the nFET source-drains 135*b* are reached. Finally the remaining photoresist is removed.

FIG. 22 illustrates a side view of the third embodiment of the CMOS integrated circuit structure 100 of FIG. 17 at a sixth contact creation stage in accordance with embodiments of the present disclosure. Prior to the view of FIG. 22, in a representative embodiment source-drain conductive caps 160 are created over both the pFET contacts 155 which are over the pFET source-drains 135*a* and the nFET source-drains 135*b*. The conductive caps 160 could be formed as shown in FIG. 8 wherein the conductive caps 160 could each comprise a first cap component 161, a second cap component 162, and a third cap component 163. The first cap components 161 could be formed by a deposition of titanium; the second cap components 162 could be formed by a deposition of titanium nitride; and the third cap components 163 could be formed by a deposition of tungsten. nFET contacts 165 comprising a titanium silicide material could be formed over the nFET source-drains 135*b* during the formation of the conductive caps 160 without additional processing steps.

Figure 23:
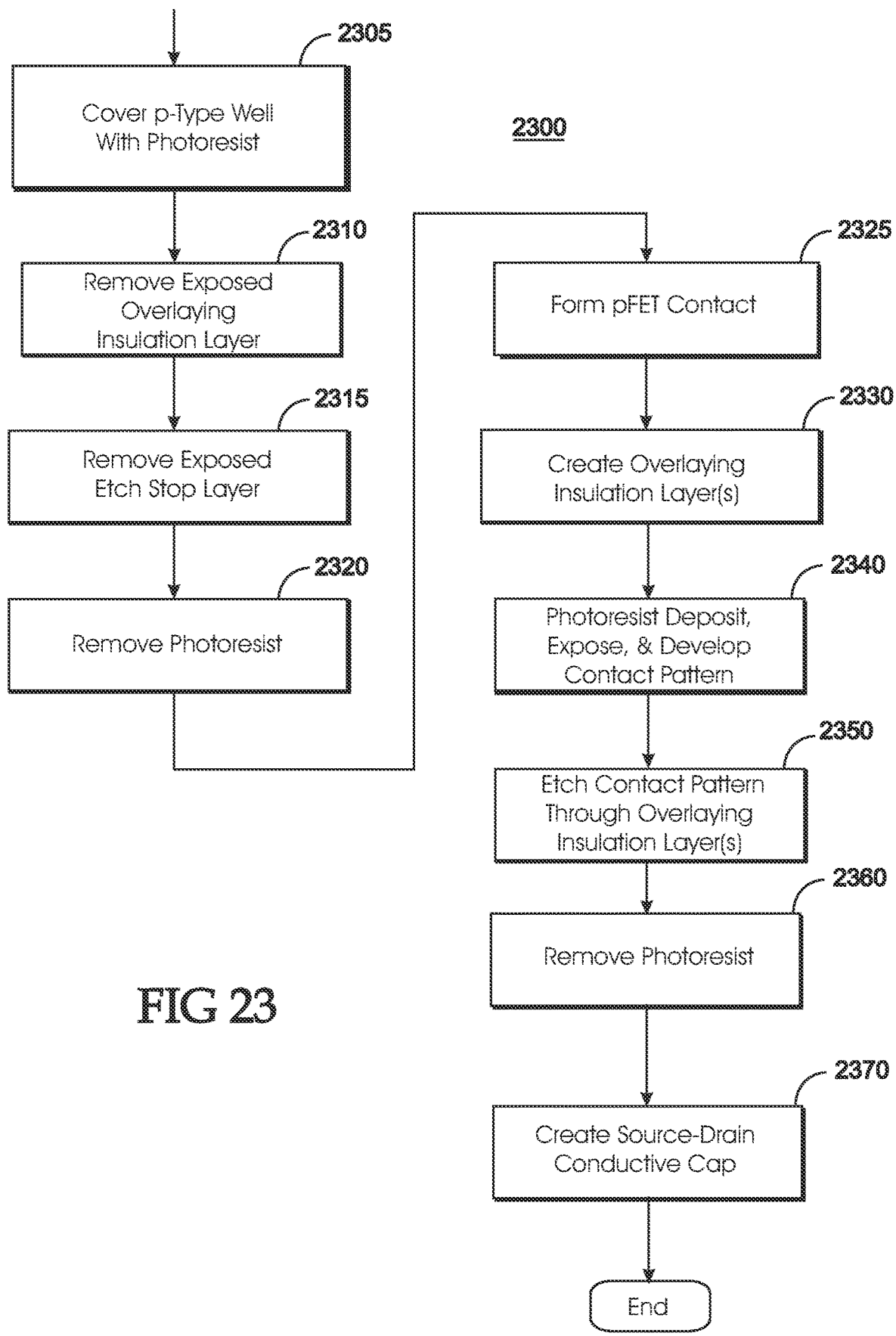
FIG. 23 illustrates a flow chart of a third method for contact creation in the first embodiment of the CMOS integrated circuit structure of FIG. 17 in accordance with embodiments of the present disclosure.

FIG. 23 illustrates a flow chart of a third method 2300 for contact creation in the first embodiment of the CMOS integrated circuit structure 100 of FIG. 17 in accordance with embodiments of the present disclosure. In block 2305 of FIG. 23 a photoresist layer 150 is appropriately applied, patterned, and developed over the CMOS integrated circuit structure 100 of FIG. 17 leaving that part of the photoresist layer 150 generally over the p-type wells 110*b*. Block 2305 then transfers control to block 2310.

In block 2310 the first overlaying insulation layer 125 is removed via a highly selective oxide removal process. Block 2310 then transfers control to block 2315.

In block 2315, the photoresist overlaying the p-type well 110*b* regions is removed. Block 2315 then transfers control to block 2320.

In block 2320, the exposed protective layer 120 is removed which removal could be effected by etching with fluoroform ($CHF_3$) or other appropriate material or by another appropriate method. Block 2320 then transfers control to block 2325.

In block 2325, pFET contacts 155 which material could be a nickel silicide material are formed on the pFET source-drains 135*a* which could be formed by a deposition of nickel platinum (NiPt) over the top of the structure 100 followed by an anneal process. During the anneal the exposed silicon areas react with the NiPt to form nickel silicide. A final wet clean step then removes all non-reacted NiPt. Block 2325 then transfers control to block 2330.

In block 2330, a first overlaying insulation layer 125 is created over appropriate areas adjacent to the n-type well 110*a* of the CMOS integrated circuit structure 100 of FIG. 20 followed by creation of a second overlaying insulation layer 130 overlaying the first overlaying insulation layer 125. Block 2330 then transfers control to block 2340.

In block 2340, photoresist is then deposited over this structure. The photoresist is exposed and developed to pattern the contact regions in the photoresist. Block 2340 then transfers control to block 2350.

In block 2350, the overlaying insulation layers are etched until the pFET contacts 155 and the nFET source-drains 135*b* are reached. Block 2350 then transfers control to block 2360.

In block 2360, the remaining photoresist is removed. Block 2360 then transfers control to block 2370.

In block 2370, source-drain conductive caps 160 are created over both the pFET contacts 155 which are over the pFET source-drains 135*a* and the nFET source-drains 135*b*. The conductive caps 160 could be formed as shown in FIG. 8 wherein the conductive caps 160 could each comprise a first cap component 161, a second cap component 162, and a third cap component 163. The first cap component 161 could be formed by a deposition of titanium; the second cap component 162 could be formed by a deposition of titanium nitride; and the third cap component 163 could be formed by a deposition of tungsten. An nFET contact 165 comprising a titanium silicide material could be formed over the nFET source-drains 135b during the formation of the conductive caps 160 without additional processing steps. Block 2370 then terminates the process.

FIG. 24 illustrates a side view of a fourth embodiment of a CMOS integrated circuit structure 100 at a first contact creation stage in accordance with embodiments of the present disclosure. In FIG. 24, an n-type well 110a and a p-type well 110b overlay and are embedded in a substrate 105. The n-type well 110a and the p-type well 110b are isolated from one another by isolation regions 115. Also embedded in the n-type well 110a are pFET source-drains 135a, and embedded in the p-type well 110b are nFET source-drains 135b. Gate dielectrics 140 overlay the gate regions between adjacent pFET source-drains 135a and between adjacent nFET source-drains 135b. Overlaying the gate dielectrics 140 are gate conductors 145. The elements of the gate conductors 145 are described with the discussion of and shown more fully in FIG. 7. In various locations on the CMOS integrated circuit 100 overlaying the substrate 105, the isolation regions 115, the nFET source-drains 135b, and the gate conductor 145 but not the pFET source-drains 135a is a protective layer 120. Overlaying the protective layer 120 and the pFET source-drains 135a is a first overlaying insulation layer 125. As used herein the element pFET source-drain 135a refers to the source and/or the drain of a pFET 180, i.e., a p-channel field-effect transistor 180, and the element nFET source-drain 135b refers to the source and/or the drain of an nFET 185, i.e., an n-channel field-effect transistor 185. For clarity and ease of illustration, the nFETs 180 and pFETs 185 of the fourth embodiment are so indicated only on FIG. 24 but are similarly located on FIGS. 25-28.

The CMOS integrated circuit structure 100 could be fabricated using well know integrated circuit processes and in particular sidewall image transfer processes. The material of the substrate 105 could be, for example, silicon or other appropriate material; the n-type well 110a could be created by, for example, appropriate masking followed by diffusion of an n-type dopant such as arsenic, phosphorus or other appropriate material into a region of the silicon substrate 105 or by another appropriate method; the p-type well 110b could be created by, for example, appropriate masking followed by diffusion of a p-type dopant such as boron or other appropriate material into a region of the silicon substrate 105 or by another appropriate method; the isolation regions 115 could be created by, for example, appropriate masking followed by etching the substrate, filling with silicon dioxide and a chemical mechanical planarization (CMP) process or other appropriate method; the protective layer 120 could be created by, for example, chemical vapour deposition of silicon nitride or other appropriate material or by another appropriate method and could be limited to the p-type wells 110b by appropriate masking and related deposition; the first overlaying insulation layer 125 could be created by, for example, chemical vapour deposition of silicon dioxide or other appropriate material or by another appropriate method; the pFET source-drains 135a could be created by, for example, appropriate masking followed by chemical vapour deposition of boron doped silicon-germanium or other appropriate material into the n-type wells 110a or by another appropriate method; the nFET source-drains 135b could be created by, for example, appropriate masking followed by chemical vapour deposition of arsenic doped silicon, silicon carbide, or other appropriate material into the p-type wells 110b or by another appropriate method; the gate dielectrics 140 over the n-type wells 110a and the p-type wells 110b could be created by, for example, appropriate masking followed by the chemical vapour deposition of hafnium oxide ($HfO_2$) or other appropriate material or by another appropriate method.

FIG. 25 illustrates a side view of the fourth embodiment of the CMOS integrated circuit structure 100 of FIG. 24 at a second contact creation stage in accordance with embodiments of the present disclosure. Prior to the view of FIG. 25, the first overlaying insulation layer 125 is removed by, for example, a selective oxide removal process.

Figure 26:
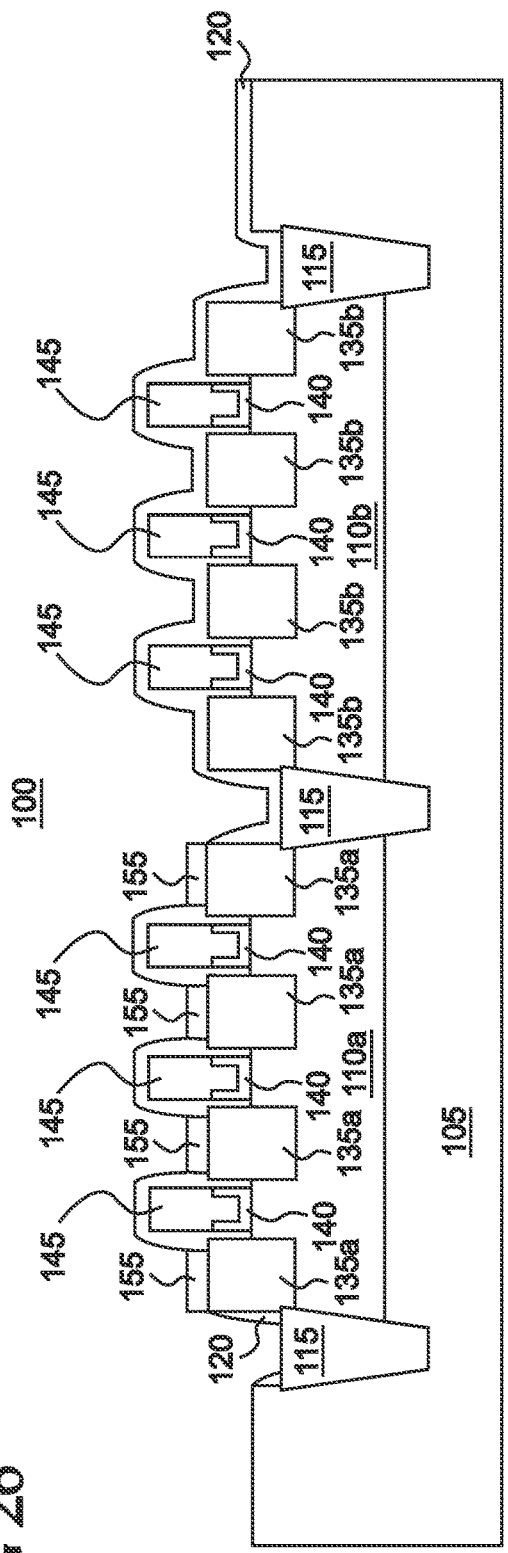
FIG. 26 illustrates a side view of the fourth embodiment of the CMOS integrated circuit structure of FIG. 24 at a third contact creation stage in accordance with embodiments of the present disclosure.

FIG. 26 illustrates a side view of the fourth embodiment of the CMOS integrated circuit structure 100 of FIG. 24 at a third contact creation stage in accordance with embodiments of the present disclosure. Prior to the view of FIG. 26, pFET contacts 155 which could be, for example, a nickel silicide material are formed on the pFET source-drains 135a which could be formed, for example, by a deposition of nickel platinum (NiPt) over the top of the structure 100 followed by an anneal process. During the anneal the exposed silicon areas react with the NiPt to form a nickel silicide. A final wet clean step then removes all non-reacted NiPt.

Figure 27:
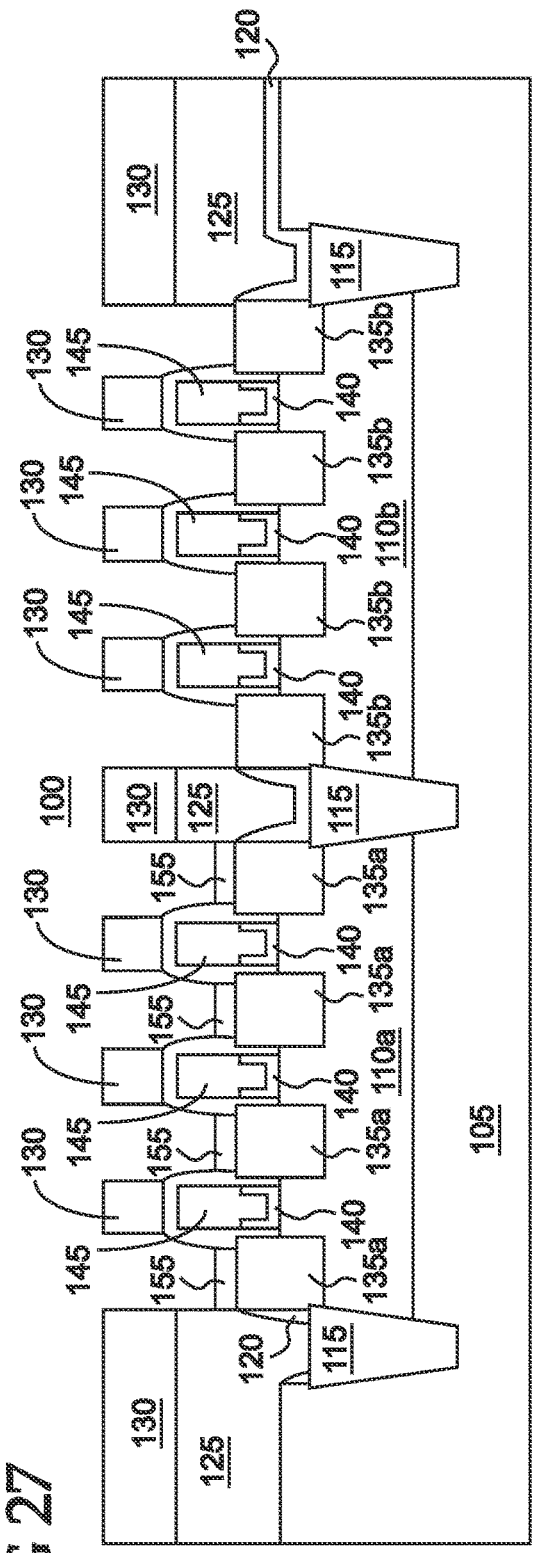
FIG. 27 illustrates a side view of the fourth embodiment of the CMOS integrated circuit structure of FIG. 24 at a fourth contact creation stage in accordance with embodiments of the present disclosure.

FIG. 27 illustrates a side view of the fourth embodiment of the CMOS integrated circuit structure 100 of FIG. 24 at a fourth contact creation stage in accordance with embodiments of the present disclosure. Prior to the view of FIG. 27, a first overlaying insulation layer 125 is created over the CMOS integrated circuit structure 100 of FIG. 26 followed by creation of a second overlaying insulation layer 130 overlaying the first overlaying insulation layer 125. The first overlaying insulation layer 125 could be created by, for example, chemical vapour deposition of silicon dioxide or other appropriate material or by another appropriate method, and the second overlaying insulation layer 130 could be created by, for example, chemical vapour deposition of silicon dioxide or other appropriate material or by another appropriate method. Photoresist is then deposited over this structure. Subsequently the photoresist is exposed and developed to pattern the contact regions in the photoresist. The overlaying insulation layers are etched until the pFET contacts 155 and the protective layers 120 over the nFET source-drains 135b are reached. Then the remaining photoresist is removed. Finally, the protective layers 120 remaining over the nFET source-drain 135b are removed. This remaining protective layer 120 could be removed by etching with $CHF_3$. On the pFET side, the nickel silicide of the pFET contact 155 is not attacked by the $CHF_3$ etch.

FIG. 28 illustrates a side view of the fourth embodiment of the CMOS integrated circuit structure 100 of FIG. 24 at a fifth contact creation stage in accordance with embodiments of the present disclosure. Prior to the view of FIG. 28, in a representative embodiment source-drain conductive caps 160 are created over both the pFET contacts 155 which are over the pFET source-drains 135a and the nFET source-drains 135b. The conductive caps 160 could be formed as shown in FIG. 8 wherein the conductive caps 160 could each comprise a first cap component 161, a second cap component 162, and a third cap component 163. The first cap components 161 could be formed by a deposition of titanium; the second cap components 162 could be formed by a deposition of titanium nitride; and the third cap components 163 could be formed by a deposition of tungsten. nFET contacts 165 comprising a titanium silicide material could be formed over the nFET source-drains 135b during the formation of the conductive caps 160 without additional processing steps.

Figure 29:
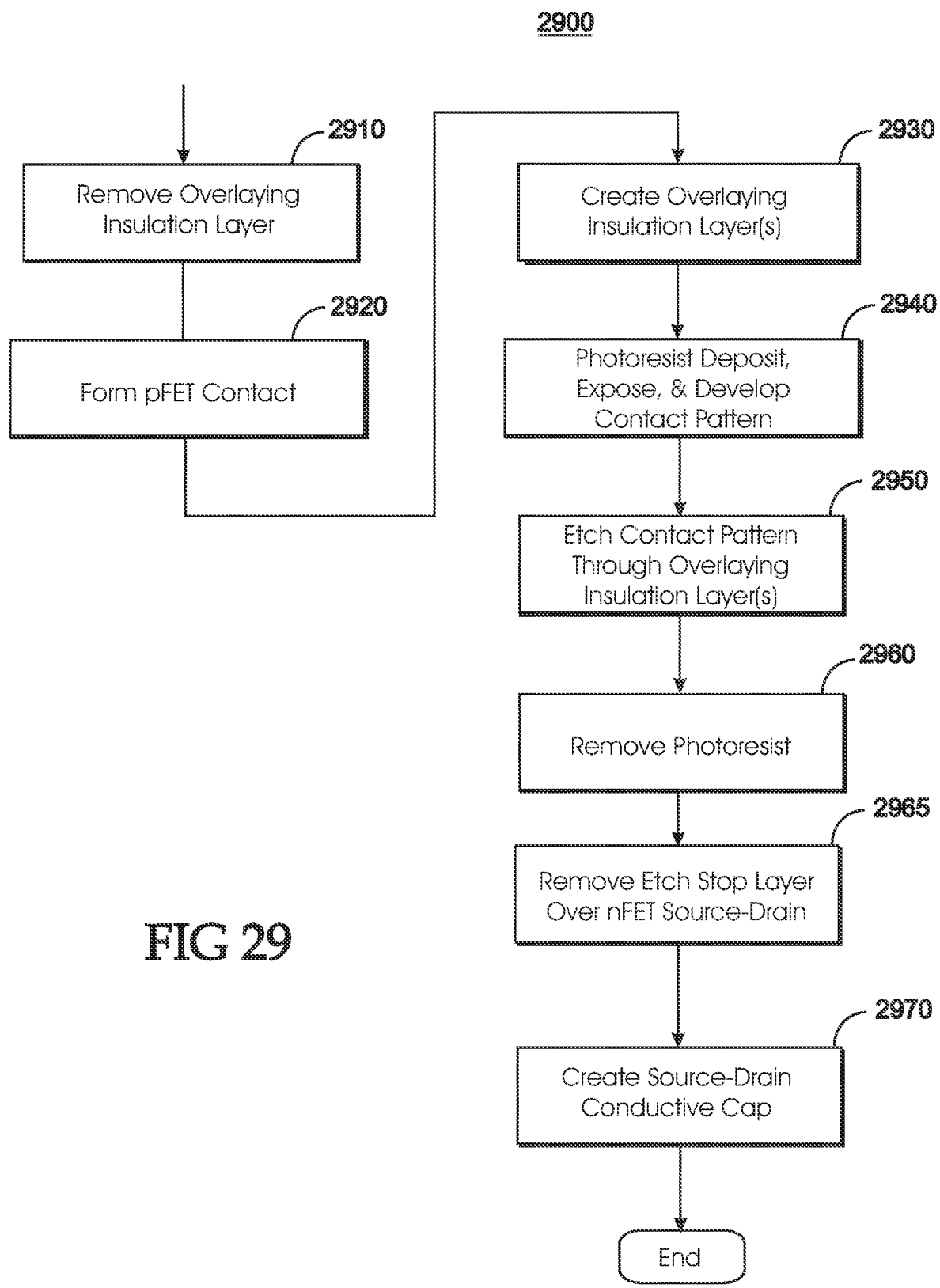
FIG. 29 illustrates a flow chart of a fourth method for contact creation in the first embodiment of the CMOS integrated circuit structure of FIG. 24 in accordance with embodiments of the present disclosure.

FIG. 29 illustrates a flow chart of a fourth method 2900 for contact creation in the first embodiment of the CMOS integrated circuit structure 100 of FIG. 24 in accordance with embodiments of the present disclosure. In block 2910 of FIG. 29, the first overlaying insulation layer 125 is removed by, for example, a selective oxide removal process. Block 2910 then transfers control to block 2920.

In block 2920, pFET contacts 155 which could be, for example, a nickel silicide material are formed on the pFET source-drains 135*a* which could be formed, for example, by a deposition of nickel platinum (NiPt) over the top of the structure 100 followed by an anneal process. During the anneal the exposed silicon areas react with the NiPt to form a nickel silicide. A final wet clean step then removes all non-reacted NiPt. Block 2920 then transfers control to block 2930.

In block 2930, a first overlaying insulation layer 125 is created over the CMOS integrated circuit structure 100 of FIG. 26 followed by creation of a second overlaying insulation layer 130 overlaying the first overlaying insulation layer 125. The first overlaying insulation layer 125 could be created by, for example, chemical vapour deposition of silicon dioxide or other appropriate material or by another appropriate method, and the second overlaying insulation layer 130 could be created by, for example, chemical vapour deposition of silicon dioxide or other appropriate material or by another appropriate method. Block 2930 then transfers control to block 2940.

In block 2940, photoresist is deposited over this structure. Subsequently the photoresist is exposed and developed to pattern the contact regions in the photoresist. Block 2940 then transfers control to block 2950.

In block 2950, The overlaying insulation layers are etched until the pFET contacts 155 and the nFET source-drains 135*b* are reached. Block 2950 then transfers control to block 2960.

In block 2960, the remaining photoresist is removed. Block 2960 then transfers control to block 2965.

In block 2965, the protective layer 120 over the nFET source-drains 135*b* is removed. This remaining protective layer 120 could be removed by etching with CHF$_3$. On the pFET side, the nickel silicide of the pFET contact 155 is not attacked by the CHF$_3$ etch. Block 2965 then transfers control to block 2970.

In block 2970, source-drain conductive caps 160 are created over both the pFET contacts 155 which are over the pFET source-drains 135*a* and the nFET source-drains 135*b*. The conductive caps 160 could be formed as shown in FIG. 8 wherein the conductive caps 160 could each comprise a first cap component 161, a second cap component 162, and a third cap component 163. The first cap component 161 could be formed by a deposition of titanium; the second cap component 162 could be formed by a deposition of titanium nitride; and the third cap component 163 could be formed by a deposition of tungsten. An nFET contact 165 comprising a titanium silicide material could be formed over the nFET source-drains 135*b* during the formation of the conductive caps 160 without additional processing steps. Block 2970 then terminates the process.

FIG. 30 illustrates a side view of a fifth embodiment of a CMOS integrated circuit structure 100 at a first contact creation stage in accordance with embodiments of the present disclosure. In FIG. 30, an n-type well 110*a* and a p-type well 110*b* overlay and are embedded in a substrate 105. The n-type well 110*a* and the p-type well 110*b* are isolated from one another by isolation regions 115. Also embedded in the n-type well 110*a* are pFET source-drains 135*a*, and embedded in the p-type well 110*b* are nFET source-drains 135*b*. Gate dielectrics 140 overlay the gate regions between adjacent pFET source-drains 135*a* and between adjacent nFET source-drains 135*b*. Overlaying the gate dielectrics 140 are gate conductors 145. The elements of the gate conductors 145 are described with the discussion of and shown more fully in FIG. 7. In various locations on the CMOS integrated circuit structure 100 overlaying the substrate 105, the isolation regions 115, the nFET source-drains 135*b*, and the gate conductor 145 but not the pFET source-drains 135*a* is a protective layer 120. Overlaying the protective layer 120 and the pFET source-drains 135*a* is a first overlaying insulation layer 125, and overlaying the first overlaying insulation layer 125 is an second overlaying insulation layer 130. As used herein the element pFET source-drain 135*a* refers to the source and/or the drain of a pFET 180, i.e., a p-channel field-effect transistor 180, and the element nFET source-drain 135*b* refers to the source and/or the drain of an nFET 185, i.e., an n-channel field-effect transistor 185. For clarity and ease of illustration, the nFETs 180 and pFETs 185 of the fifth embodiment are so indicated only on FIG. 30 but are similarly located on FIGS. 31-34.

The CMOS integrated circuit structure 100 could be fabricated using well know integrated circuit processes and in particular sidewall image transfer processes. The material of the substrate 105 could be, for example, silicon or other appropriate material; the n-type well 110*a* could be created by, for example, appropriate masking followed by diffusion of an n-type dopant such as arsenic, phosphorus or other appropriate material into a region of the silicon substrate 105 or by another appropriate method; the p-type well 110*b* could be created by, for example, appropriate masking followed by diffusion of a p-type dopant such as boron or other appropriate material into a region of the silicon substrate 105 or by another appropriate method; the isolation regions 115 could be created by, for example, appropriate masking followed by etching the substrate, filling with silicon dioxide and a chemical mechanical planarization (CMP) process or other appropriate method; the protective layer 120 could be created by, for example, chemical vapour deposition of silicon nitride or other appropriate material or by another appropriate method and could be limited to the p-type wells 110*b* by appropriate masking and related deposition; the first overlaying insulation layer 125 could be created by, for example, chemical vapour deposition of silicon dioxide or other appropriate material or by another appropriate method; the second overlaying insulation layer 130 could be created by, for example, chemical vapour deposition of silicon dioxide or other appropriate material or by another appropriate method; the pFET source-drains 135*a* could be created by, for example, appropriate masking followed by chemical vapour deposition of boron doped silicon-germanium or other appropriate material into the n-type wells 110*a* or by another appropriate method; the nFET source-drains 135*b* could be created by, for example, appropriate masking followed by chemical vapour deposition of arsenic doped silicon, silicon carbide, or other appropriate material into the p-type wells 110*b* or by another appropriate method; the gate dielectrics 140 over the n-type wells 110*a* and the p-type wells 110*b* could be created by, for example, appropriate masking followed by the chemical vapour deposition of hafnium oxide (HfO$_2$) or other appropriate material or by another appropriate method.

FIG. 31 illustrates a side view of the fifth embodiment of the CMOS integrated circuit structure 100 of FIG. 30 at a second contact creation stage in accordance with embodiments of the present disclosure. Prior to the view of FIG. 31, photoresist is deposited over this structure. Subsequently the photoresist is exposed and developed to pattern the contact regions in the photoresist. The overlaying insulation layers 125,130 are removed by, for example, a selective oxide removal process until the pFET source-drains 135*a* and the protective layer 120 over the nFET source-drains 135*b* are reached. Finally the remaining photoresist is removed.

Figure 32:
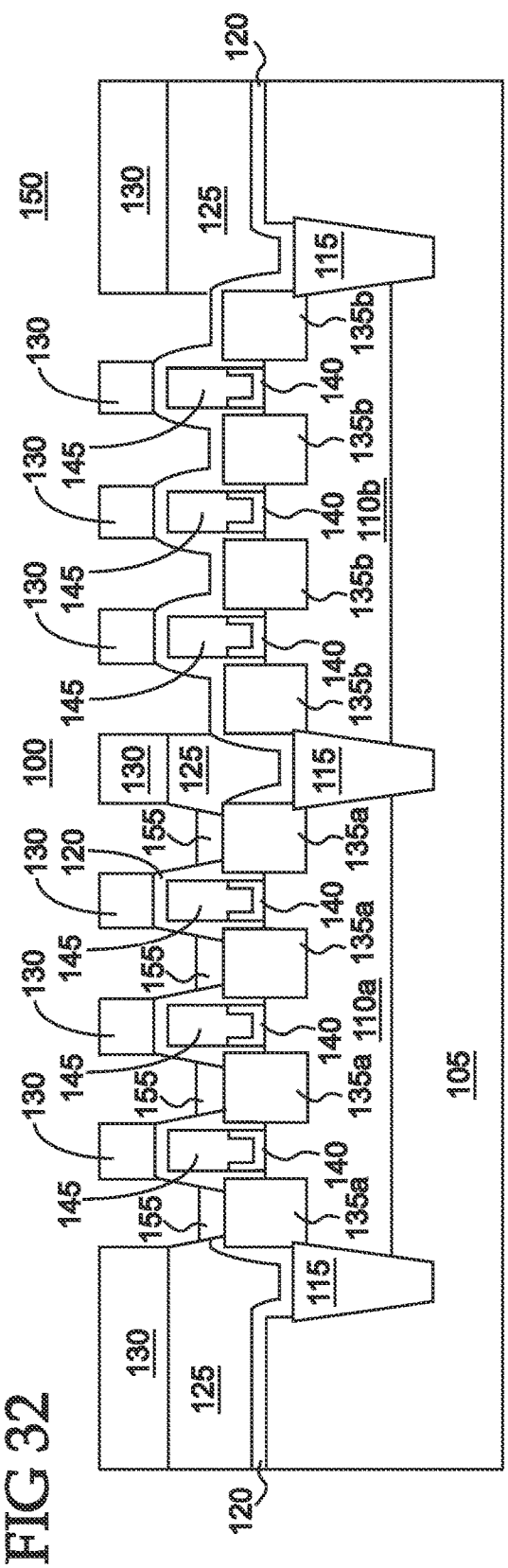
FIG. 32 illustrates a side view of the fifth embodiment of the CMOS integrated circuit structure of FIG. 30 at a third contact creation stage in accordance with embodiments of the present disclosure.

FIG. 32 illustrates a side view of the fifth embodiment of the CMOS integrated circuit structure 100 of FIG. 30 at a third contact creation stage in accordance with embodiments of the present disclosure. Prior to the view of FIG. 32, pFET contacts 155 which could be, for example, a nickel silicide material are formed on the pFET source-drains 135*a* which could be formed, for example, by a deposition of nickel platinum (NiPt) over the top of the structure 100 followed by an anneal process. During the anneal the exposed silicon areas react with the NiPt to form a nickel silicide. A final wet clean step then removes all non-reacted NiPt.

Figure 33:
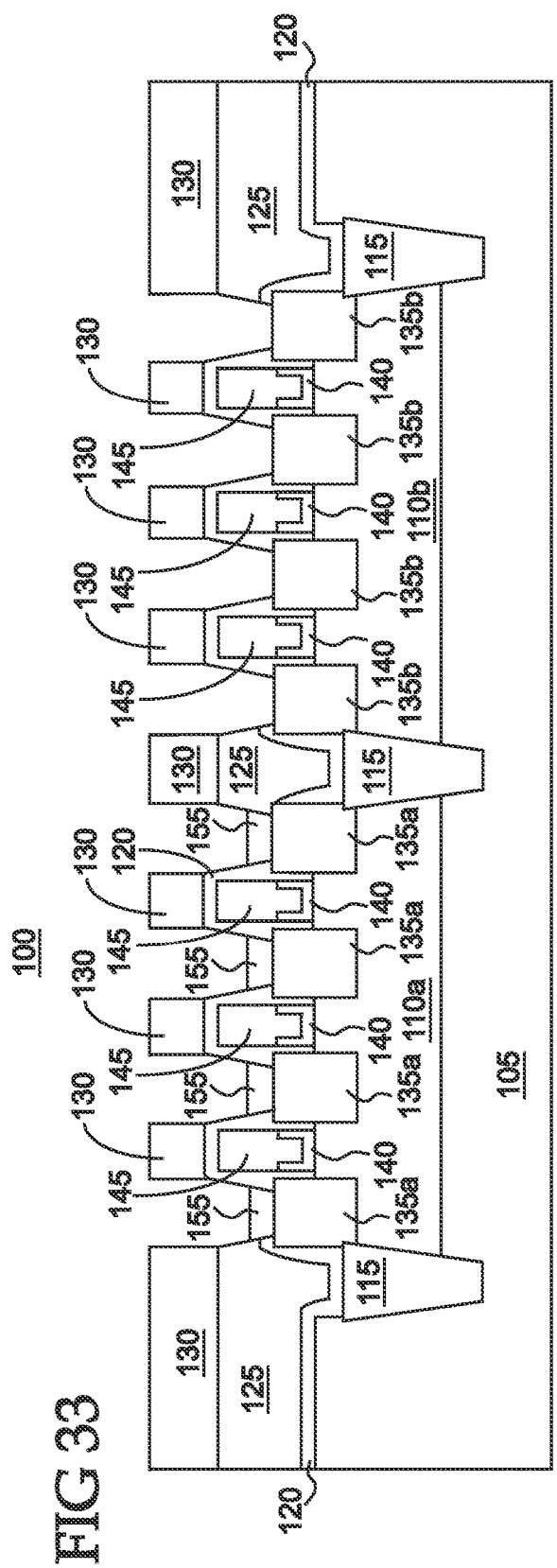
FIG. 33 illustrates a side view of the fourth embodiment of the CMOS integrated circuit structure of FIG. 30 at a fourth contact creation stage in accordance with embodiments of the present disclosure.

FIG. 33 illustrates a side view of the fourth embodiment of the CMOS integrated circuit structure 100 of FIG. 30 at a fourth contact creation stage in accordance with embodiments of the present disclosure. Prior to the view of FIG. 33, the protective layers 120 over the nFET source-drains 135*b* are removed which removal could be effected by fluoroform ($CHF_3$) or other appropriate material or by another appropriate method.

Figure 34:
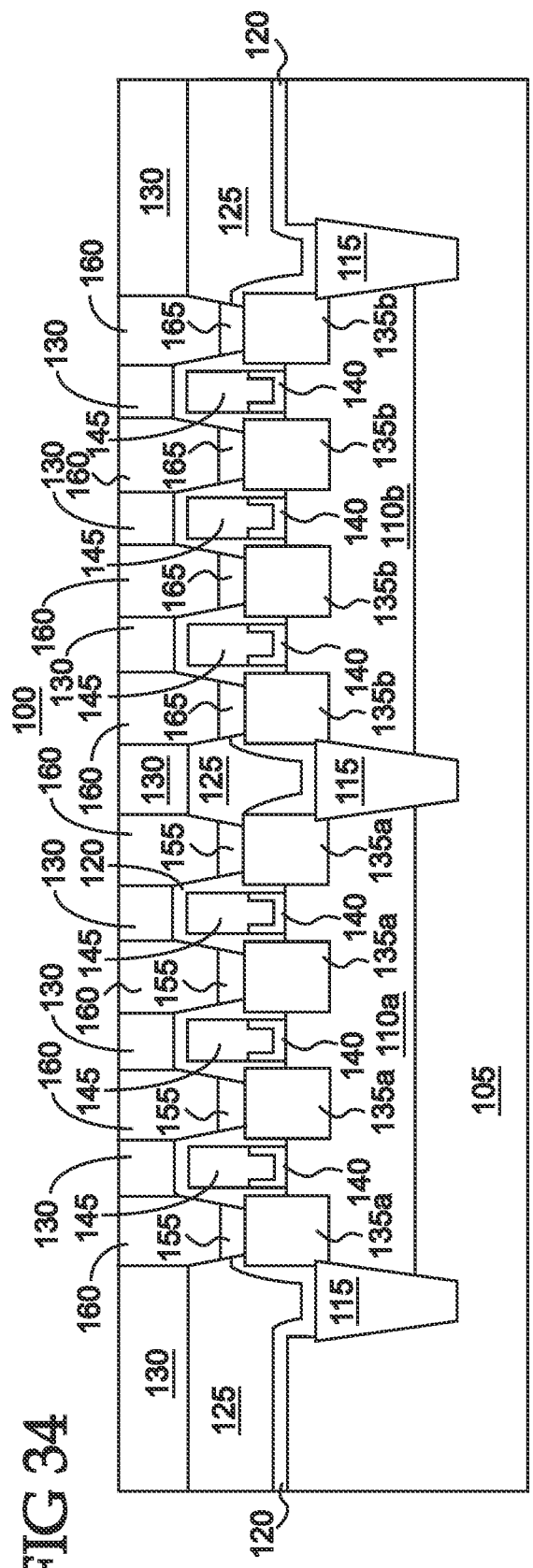
FIG. 34 illustrates a side view of the fifth embodiment of the CMOS integrated circuit structure of FIG. 30 at a fifth contact creation stage in accordance with embodiments of the present disclosure.

FIG. 34 illustrates a side view of the fifth embodiment of the CMOS integrated circuit structure 100 of FIG. 30 at a fifth contact creation stage in accordance with embodiments of the present disclosure. Prior to the view of FIG. 34, in a representative embodiment source-drain conductive caps 160 are created over both the pFET contacts 155 which are over the pFET source-drains 135*a* and the nFET source-drains 135*b*. The conductive caps 160 could be formed as shown in FIG. 8 wherein the conductive caps 160 could each comprise a first cap component 161, a second cap component 162, and a third cap component 163. The first cap components 161 could be formed by a deposition of titanium; the second cap components 162 could be formed by a deposition of titanium nitride; and the third cap components 163 could be formed by a deposition of tungsten. nFET contacts 165 comprising a titanium silicide material could be formed over the nFET source-drains 135*b* during the formation of the conductive caps 160 without additional processing steps.

Figure 35:
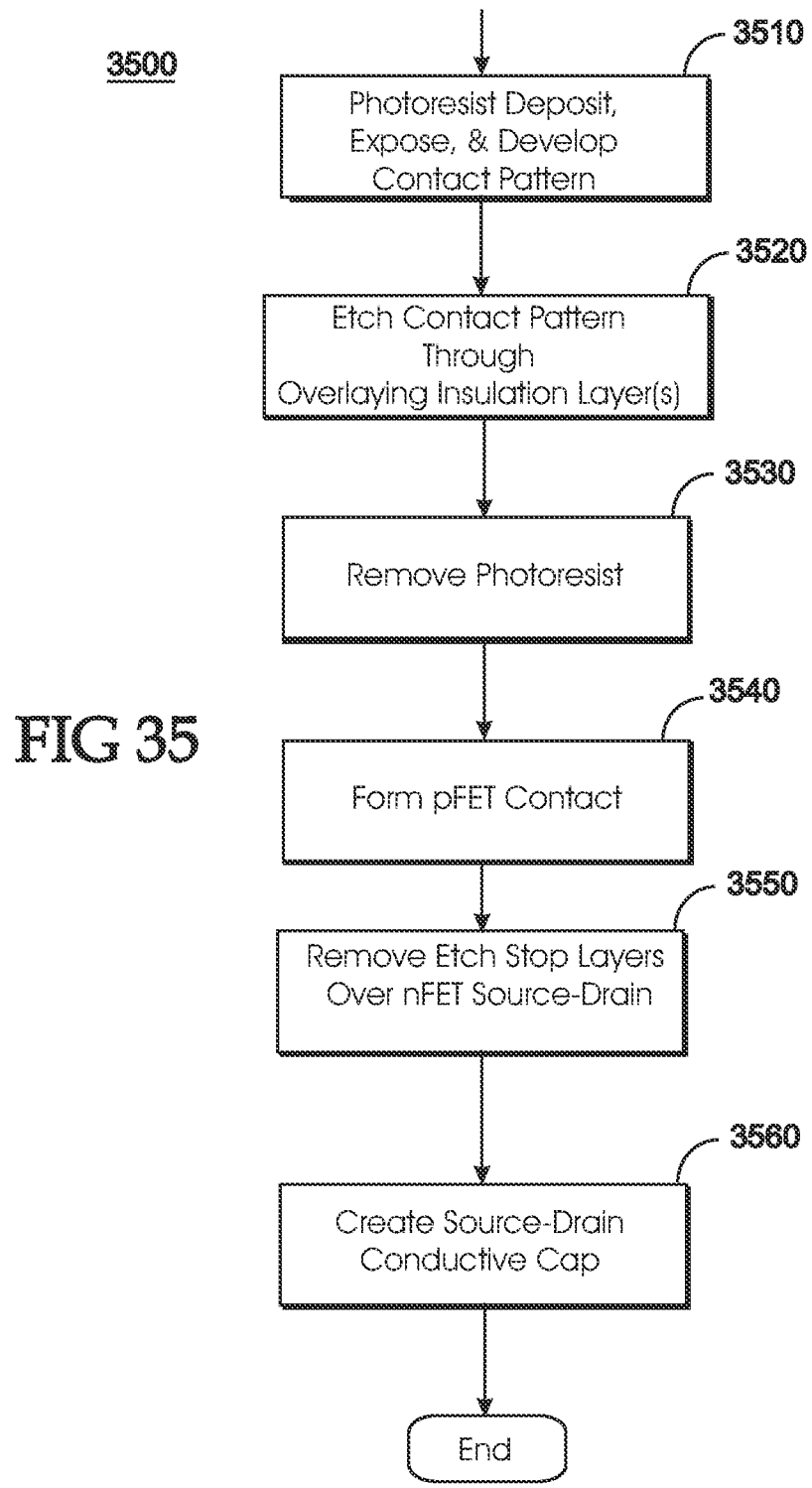
FIG. 35 illustrates a flow chart of a fifth method for contact creation in the first embodiment of the CMOS integrated circuit structure of FIG. 30 in accordance with embodiments of the present disclosure.

FIG. 35 illustrates a flow chart of a fifth method 3500 for contact creation in the first embodiment of the CMOS integrated circuit structure 100 of FIG. 30 in accordance with embodiments of the present disclosure. In block 3510 of FIG. 35, photoresist is deposited over this structure. Subsequently the photoresist is exposed and developed to pattern the contact regions in the photoresist. Block 3510 then transfers control to block 3520.

In block 3520, the overlaying insulation layers 125,130 are etched until the pFET contacts 155 and the nFET source-drains 135*b* are reached. Block 3520 then transfers control to block 3530.

In block 3530, the remaining photoresist is removed. Block 3530 then transfers control to block 3540.

In block 3540, pFET contacts 155 which could be, for example, a nickel silicide material are formed on the pFET source-drains 135*a* which could be formed, for example, by a deposition of nickel platinum (NiPt) over the top of the structure 100 followed by an anneal process. During the anneal the exposed silicon areas react with the NiPt to form a nickel silicide. A final wet clean step then removes all non-reacted NiPt. Block 3540 then transfers control to block 3550.

In block 3550, the protective layers 120 remaining over the nFET source-drains 135*b* are removed. This remaining protective layer 120 could be removed by etching with $CHF_3$. On the pFET side, the nickel silicide of the pFET contact 155 is not attacked by the $CHF_3$ etch. Block 3550 then transfers control to block 3560.

In block 3560, source-drain conductive caps 160 are created over both the pFET contacts 155 which are over the pFET source-drains 135*a* and the nFET source-drains 135*b*. The conductive caps 160 could be formed as shown in FIG. 8 wherein the conductive caps 160 could each comprise a first cap component 161, a second cap component 162, and a third cap component 163. The first cap component 161 could be formed by a deposition of titanium; the second cap component 162 could be formed by a deposition of titanium nitride; and the third cap component 163 could be formed by a deposition of tungsten. An nFET contact 165 comprising a titanium silicide material could be formed over the nFET source-drains 135*b* during the formation of the conductive caps 160 without additional processing steps. Block 3560 then terminates the process.

Figure 36:
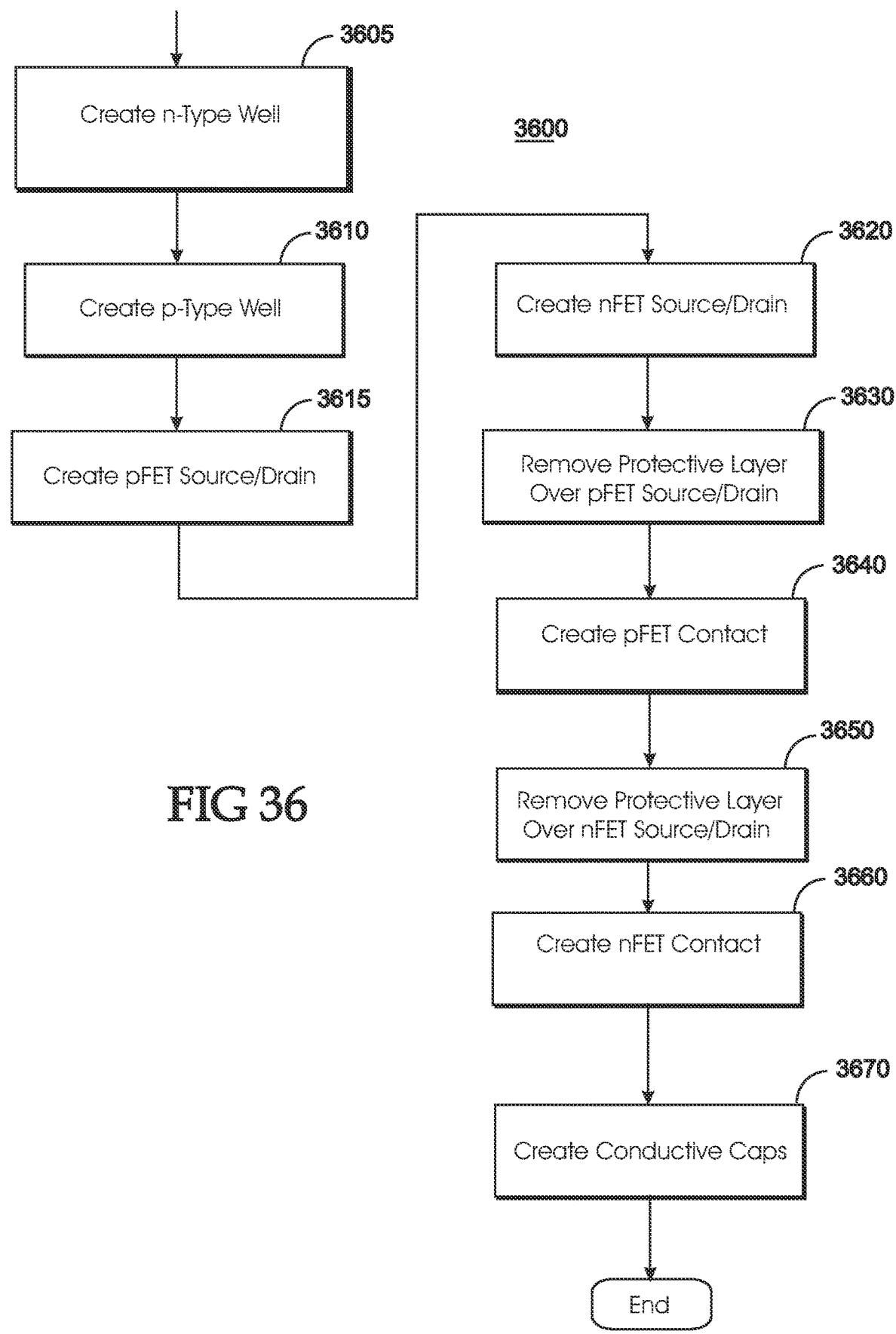
FIG. 36 illustrates a flow chart of a sixth method for contact creation in a CMOS integrated circuit structure in accordance with embodiments of the present disclosure.

FIG. 36 illustrates a flow chart of a sixth method 3600 for contact creation in a CMOS integrated circuit structure 100 in accordance with embodiments of the present disclosure. In block 3605 of FIG. 36, one or more n-type wells 110*a* are created wherein the creation can be effected, for example, using techniques described herein. Block 3605 then transfers control to block 3610.

In block 3610, one or more p-type wells 110*b* are created wherein the creation can be effected, for example, using techniques described herein. Block 3610 then transfers control to block 3615.

In block 3615, one or more pFET source-drains 135*a* are created embedded in and overlaying each of the one or more n-type wells 110*a* wherein the creation can be effected, for example, using techniques described herein and wherein a material of each of the one or more pFET source-drains 135*a* comprises silicon doped with a p-type material. Block 3615 then transfers control to block 3620.

In block 3620, one or more nFET source-drains 135*b* are created embedded in and overlaying each of the one or more p-type wells 110*b* wherein the creation can be effected, for example, using techniques described herein and wherein a material of each of the one or more nFET source-drains 135*b* comprises silicon doped with a n-type material. Block 3620 then transfers control to block 3630.

In block 3630, a protective layer 120 over the one or more pFET source-drains 135*a* is removed wherein the removal can be effected, for example, using techniques described herein. Block 3630 then transfers control to block 3640.

In block 3640, a pFET contact 155 overlaying each of the one or more pFET source-drains 135*a* is created wherein the creation can be effected, for example, using techniques described herein and wherein a material of each pFET contact 155 comprises nickel silicide. Block 3640 then transfers control to block 3650.

In block 3650, a protective layer 120 over the one or more nFET source-drains 135*b* is removed wherein the removal can be effected, for example, using techniques described herein. Block 3650 then transfers control to block 3660.

In block 3660, an nFET contact 165 overlaying each of the one or more nFET source-drains 135*b* is created wherein the creation can be effected, for example, using techniques described herein and wherein a material of each nFET contact 165 comprises titanium silicide. Block 3660 then transfers control to block 3670.

In block 3660, an nFET contact 165 overlaying each of the one or more nFET source-drains 135b is created wherein the creation can be effected, for example, using techniques described herein and wherein a material of each nFET contact 165 comprises titanium silicide.

In block 3670, source-drain conductive caps 160 are created over both the pFET contacts 155 which are over the pFET source-drains 135a and the nFET source-drains 135b wherein the creation can be effected, for example, using techniques and materials described herein. Block 3670 then terminates the process.

In a representative embodiment, a method 3600 for fabricating a CMOS integrated circuit structure 100. The method 1000 comprises creating one or more n-type wells 110a, creating one or more p-type wells 110b, creating one or more pFET source-drains 135a embedded in each of the one or more n-type wells 110a, creating one or more nFET source-drains 135b embedded in each of the one or more p-type wells 110b, creating a pFET contact 155 overlaying each of the one or more pFET source-drains 135a, and creating an nFET contact 165 overlaying each of the one or more nFET source-drains 135b. A material of each of the one or more pFET source-drains 135a comprises silicon doped with a p-type material; a material of each of the one or more nFET source-drains 135b comprises silicon doped with an n-type material; a material of each pFET contact 155 comprises nickel silicide; and a material of each nFET contact 165 comprises titanium silicide.

In another representative embodiment, a CMOS integrated circuit structure 100 is disclosed. The CMOS integrated circuit structure 100 comprises one or more n-type wells 110a, one or more pFET source-drains 135a embedded in each of the one or more n-type wells 110a, a pFET contact 155 overlaying each of the one or more pFET source-drains 135a, one or more p-type wells 110b, one or more nFET source-drains 135b embedded in each of the one or more p-type wells 110b, and an nFET contact 165 overlaying each of the one or more nFET source-drains 135b. A material of the one or more pFET source-drains 135a comprises silicon doped with a p-type material; a material of each pFET contacts 155 comprises nickel silicide; a material of each of the one or more nFET source-drains 135b comprises silicon doped with an n-type material; and a material of each nFET contacts 165 comprises titanium silicide.

The embodiments of the present disclosure described above are intended to be merely exemplary. It will be appreciated by those of skill in the art that alterations, modifications and variations to the illustrative embodiments disclosed herein may be made without departing from the scope of the present disclosure. Moreover, selected features from one or more of the above-described exemplary embodiments may be combined to create alternative embodiments not explicitly shown and described herein.

The present disclosure may be embodied in other specific forms without departing from its spirit or essential characteristics. The described exemplary embodiments are to be considered in all respects only as illustrative and not restrictive. The scope of the disclosure is, therefore, indicated by the appended claims rather than by the foregoing description. All changes that come within the meaning and range of equivalency of the claims are to be embraced within their scope.

What is claimed is:

1. A method for fabricating an integrated circuit structure, the method comprising:
    forming a first conductivity type well;
    forming a second conductivity type well;
    forming a plurality of second conductivity type field effect transistor (FET) source-drains in and overlaying the first conductivity type well;
    forming a plurality of first conductivity type FET source-drains in and overlaying the second conductivity type well;
    forming a plurality of second conductivity type FET contacts respectively overlaying the plurality of second conductivity type FET source-drains;
    forming a plurality of first conductivity type FET contacts respectively overlaying the plurality of first conductivity type FET source-drains; and
    forming a conductive cap on each of the plurality of first conductivity type FET contacts and the plurality of the second conductivity type FET contacts, the forming of the conductive cap including:
        forming a first layer having a trench including a base and a sidewall;
        forming a second layer in the trench; and
        forming a third layer in the trench and on the second layer, the third layer directly contacting the first layer and the second layer, the second and third layers being made of different materials, the third layer fills the trench more than the second layer.

2. The method as recited in claim 1, further comprising:
    forming a protective layer over the plurality of second conductivity type FET source-drains; and
    removing the protective layer prior to forming of the plurality of second conductivity type FET contacts.

3. The method as recited in claim 2, wherein the protective layer includes silicon nitride.

4. The method as recited in claim 1, wherein forming of the plurality of first conductivity type FET contacts respectively over the plurality of first conductivity type FET source-drains is prevented by a protective layer during the forming of the plurality of second conductivity type FET contacts.

5. The method as recited in claim 4, wherein the protective layer includes silicon nitride.

6. The method as recited in claim 4, further comprising:
    removing the protective layer over the plurality of first conductivity type FET source-drains after forming of the plurality of second conductivity type FET contacts.

7. The method as recited in claim 1, wherein the first layer includes titanium, the second layer includes titanium nitride, and the third layer includes tungsten.

8. The method as recited in claim 1, wherein the integrated circuit structure is fabricated using a process including a sidewall image transfer process.

9. The method as recited in claim 1, wherein each of the plurality of second conductivity type FET contacts and each of the plurality of first conductivity type FET contacts are self-aligned.

10. A method for fabricating an integrated circuit structure, the method comprising:
    forming one or more first conductivity type wells;
    forming one or more second conductivity type wells;
    forming one or more second conductivity type field effect transistor (FET) source-drains in and overlaying each of the one or more first conductivity type wells;
    forming one or more first conductivity type FET source-drains in and overlaying each of the one or more second conductivity type wells;
    forming one or more second conductivity type FET contacts respectively overlaying the one or more second conductivity type FET source-drains;

forming one or more first conductivity type FET contacts respectively overlaying the one or more first conductivity type FET source-drains; and forming multi-layer conductive caps over each first and second conductivity types FET contact, each of the multi-layer conductive caps including:

a first liner layer forming a sidewall and a base of a recess, the sidewall having a first portion and a second portion on the first portion;

a second layer within the recess and on the base of the recess, the second layer extending from the base of the recess, along the first portion of the sidewall, and up to an interface between the first and second portions, the second layer having a first material, the second layer including titanium nitride; and a third layer within the recess and on the second layer, the third layer extending from the interface between the first and second portions of the sidewall and along the second portion of the sidewall, the third layer having a second material different from the first material.

11. The method as recited in claim 10, further comprising:
forming a protective layer over the one or more second conductivity type FET source-drains; and
removing the protective layer prior to forming of the one or more second conductivity type FET contacts.

12. The method as recited in claim 11, wherein the protective layer comprises silicon nitride.

13. The method as recited in claim 10, wherein forming of the one or more first conductivity type FET contacts respectively over the one or more first conductivity type FET source-drains is prevented by a protective layer during the forming of the one or more second conductivity type FET contacts.

14. The method as recited in claim 13, wherein the protective layer comprises silicon nitride.

15. The method as recited in claim 10, wherein the integrated circuit structure is fabricated using a process comprising a sidewall image transfer process.

16. The method as recited in claim 10, wherein each of the one or more second conductivity type FET contacts and each of the one or more first conductivity type FET contacts are self-aligned.

17. The method as recited in claim 10, wherein the first liner layer comprises titanium.

18. The method as recited in claim 10, wherein the third layer comprises tungsten.

19. A method, comprising:
forming a first well in a substrate, the first well having a first conductivity type;
forming first and second source-drain regions in the first well, the first and second source-drain regions having a second conductivity type;
forming first and second contacts on the first and second source-drain regions, respectively, the first and second contacts having the second conductivity type; and
forming a conductive cap on each of the first and second contacts, the forming of the conductive cap including:
forming a first layer having a first trench including a base and sidewall, the sidewall including first and second portions, the second portion being spaced from the base by the first portion, the first portion being smaller than the second portion;
forming a second layer in the first trench, the second layer filling the first trench from the base of the first trench, along the first portion of the sidewall, and up to a point where the first and the second portions of the sidewall meet; and
forming a third layer in the first trench and on the second layer, the third layer filling the first trench from the point where the first and second portions of the sidewall meet and along the second portion of the sidewall, the second and third layers being made of different materials.

20. The method of claim 19, further comprising:
forming a second well in the substrate, the second well having the second conductivity type;
forming third and fourth source-drain regions in the second well, the third and fourth source-drain regions having the first conductivity type;
forming third and fourth contacts on the third and fourth source-drain regions, respectively, the third and fourth contacts having the first conductivity type; and
forming the conductive cap on each of the third and fourth contacts.

21. The method of claim 19, further comprising:
forming a gate structure between the first and second source-drain regions, the forming of the gate structure including:
forming a fourth layer having a second trench;
forming a fifth layer in the second trench; and
forming a sixth layer on the fourth layer and the fifth layer, the fourth, fifth, and sixth layers being made of different materials.

* * * * *